(12) United States Patent
Shingu et al.

(10) Patent No.: US 9,831,180 B2
(45) Date of Patent: Nov. 28, 2017

(54) SEMICONDUCTOR DEVICE AND METHOD FOR MANUFACTURING SAME

(71) Applicant: Toshiba Memory Corporation, Minato-ku (JP)

(72) Inventors: Masao Shingu, Yokkaichi (JP); Kenta Yamada, Yokkaichi (JP); Masaaki Higuchi, Yokohama (JP); Daigo Ichinose, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/268,034

(22) Filed: Sep. 16, 2016

(65) Prior Publication Data

US 2017/0263558 A1    Sep. 14, 2017

Related U.S. Application Data

(60) Provisional application No. 62/306,204, filed on Mar. 10, 2016.

(51) Int. Cl.
*H01L 29/788* (2006.01)
*H01L 21/20* (2006.01)
(Continued)

(52) U.S. Cl.
CPC .... *H01L 23/5283* (2013.01); *H01L 21/76816* (2013.01); *H01L 21/76877* (2013.01);
(Continued)

(58) Field of Classification Search
CPC ............ H01L 23/5283; H01L 23/5226; H01L 21/76816; H01L 23/76877; H01L 21/1157; H01L 27/11582
(Continued)

(56) References Cited

U.S. PATENT DOCUMENTS 8,247,860 B2    8/2012   Iwase et al.
8,361,862 B2    1/2013   Fukuzumi et al.
(Continued)

FOREIGN PATENT DOCUMENTS

JP    2010-205904    9/2010
JP    5306080        10/2013

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

According to the embodiment, the semiconductor device includes: a substrate; a stacked body; and a plurality of columnar portions. The stacked body is provided on the substrate. The stacked body includes a plurality of electrode layers stacked with an insulator interposed. The stacked body includes a stacked portion and a staircase portion. The plurality of electrode layers includes a first portion and a second portion. The columnar portions are provided in the stacked portion of the stacked body. The columnar portions extend in a stacking direction of the stacked body. The columnar portions include a semiconductor body extending in the stacking direction and a charge storage film. The second portion includes a third portion. A thickness of the third portion along the stacking direction is thinner than a thickness of the first portion along the stacking direction.

16 Claims, 37 Drawing Sheets

(51) Int. Cl.
*H01L 23/528* (2006.01)
*H01L 27/1157* (2017.01)
*H01L 27/11582* (2017.01)
*H01L 23/522* (2006.01)
*H01L 21/768* (2006.01)

(52) U.S. Cl.
CPC ...... *H01L 23/5226* (2013.01); *H01L 27/1157* (2013.01); *H01L 27/11582* (2013.01)

(58) Field of Classification Search
USPC .................................................. 257/326, 315
See application file for complete search history.

(56) References Cited

U.S. PATENT DOCUMENTS

| | | | |
|---|---|---|---|
| 2011/0001178 A1* | 1/2011 | Iwase | ................ H01L 21/28282 257/315 |
| 2012/0119287 A1 | 5/2012 | Park et al. | |
| 2014/0070302 A1 | 3/2014 | Yoo et al. | |
| 2016/0064281 A1* | 3/2016 | Izumi | ................ H01L 21/76816 257/315 |

* cited by examiner

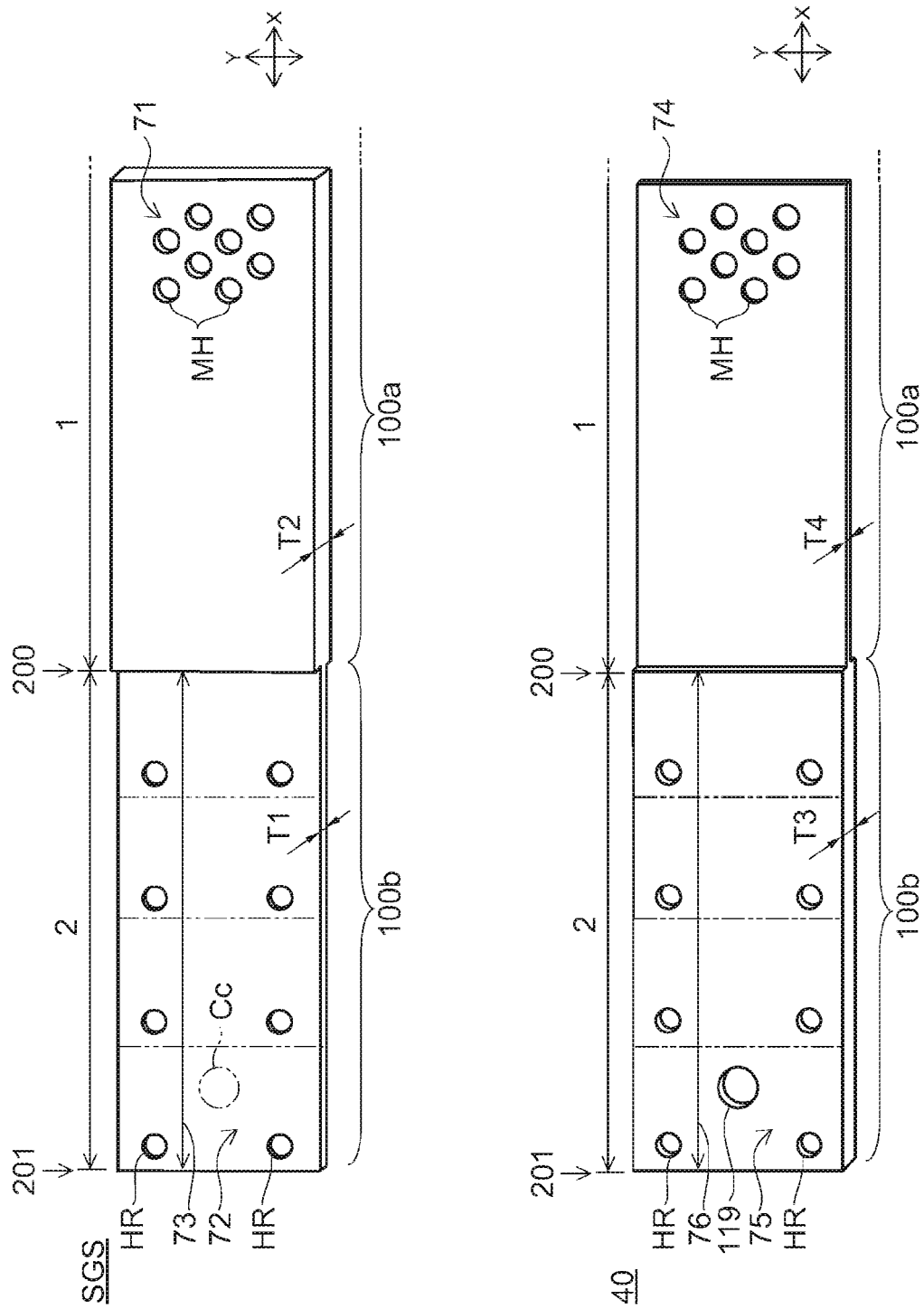

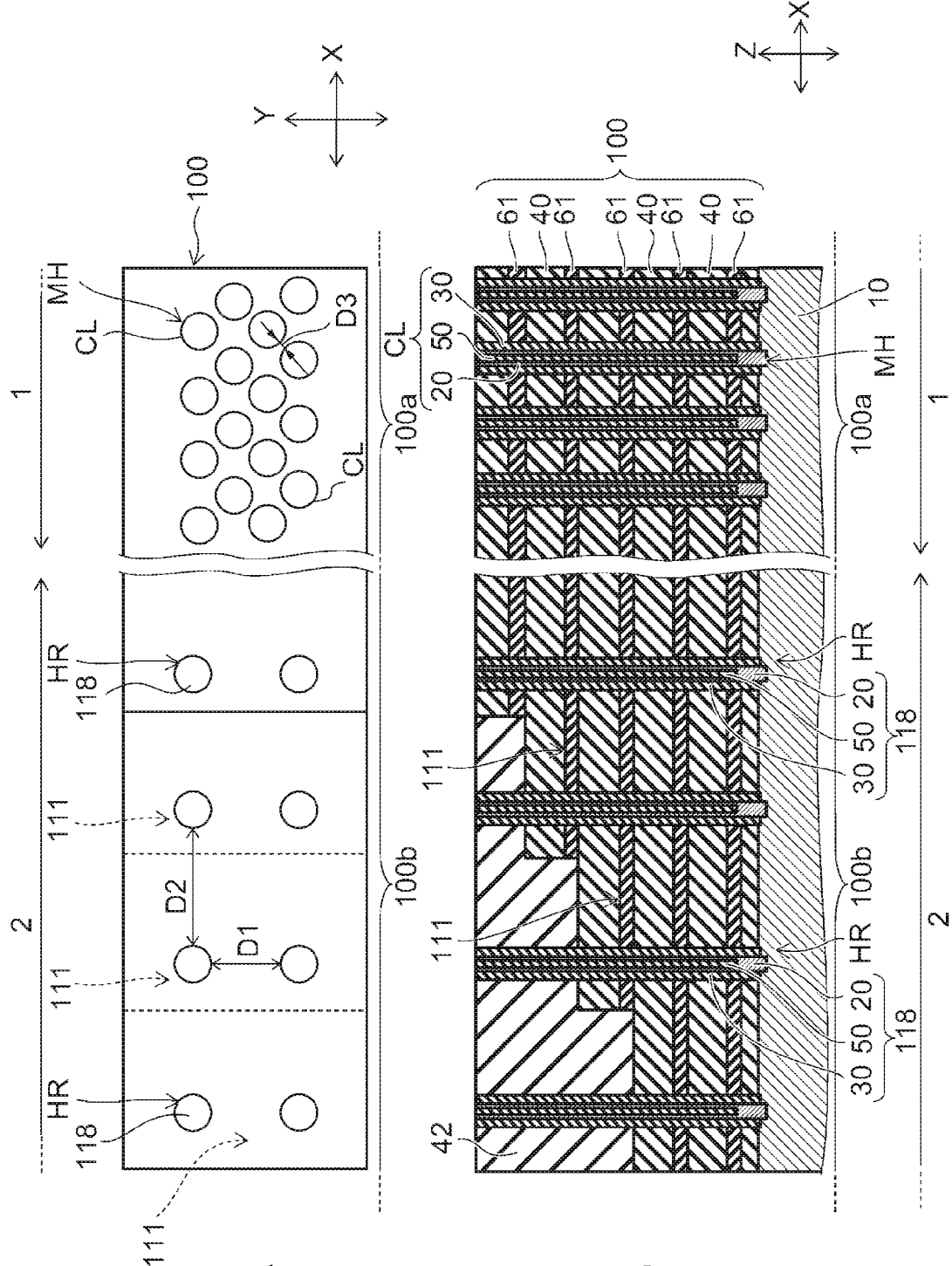

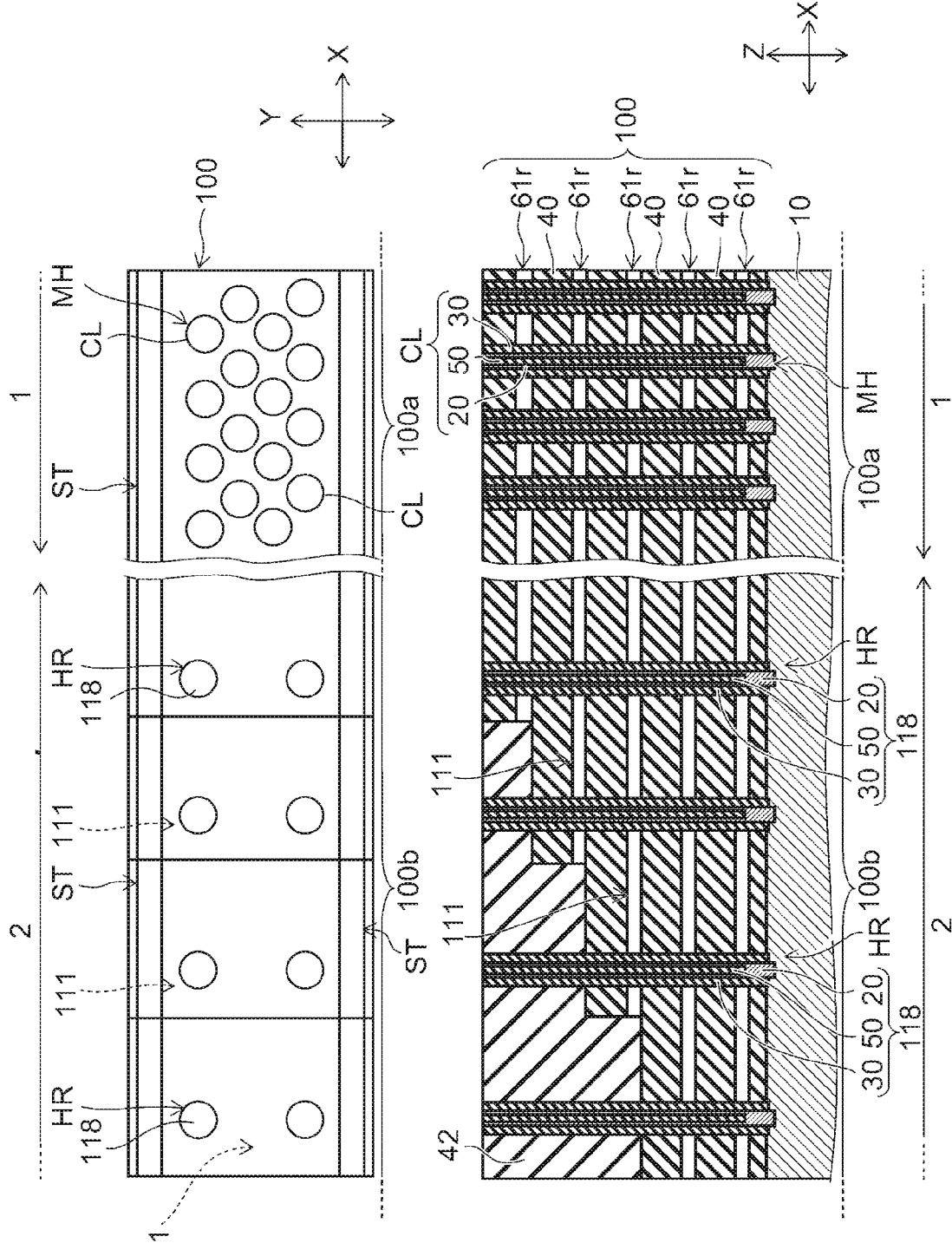

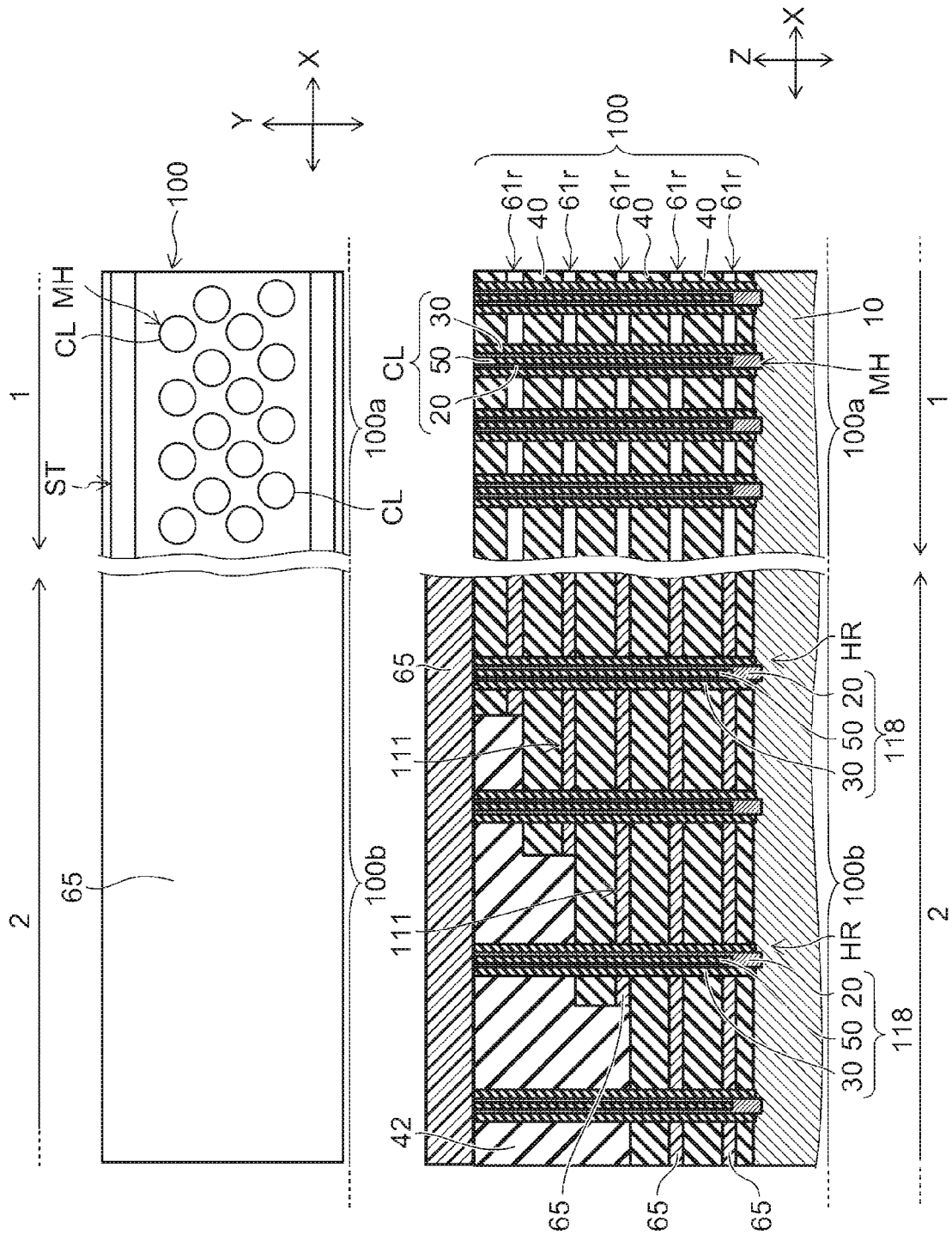

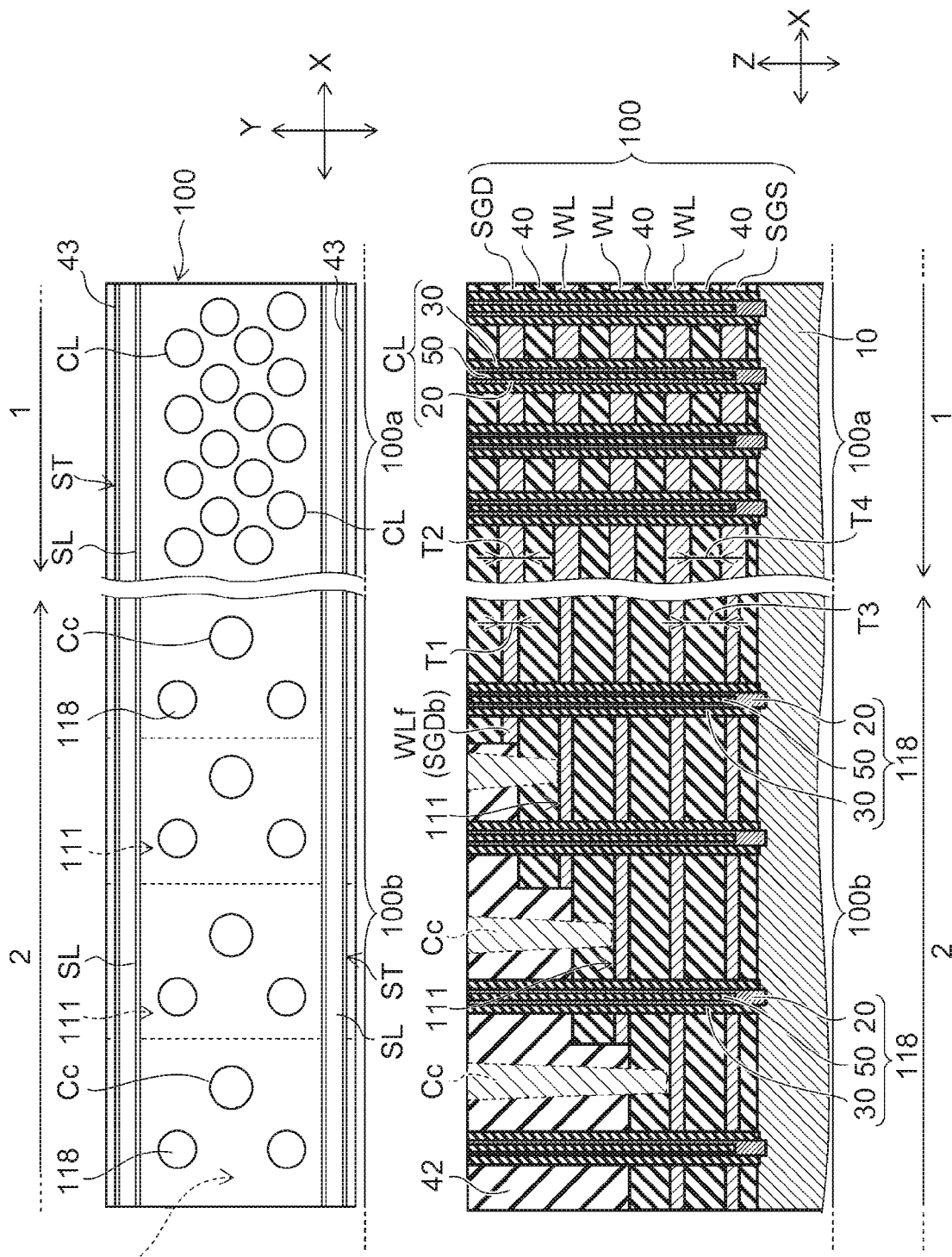

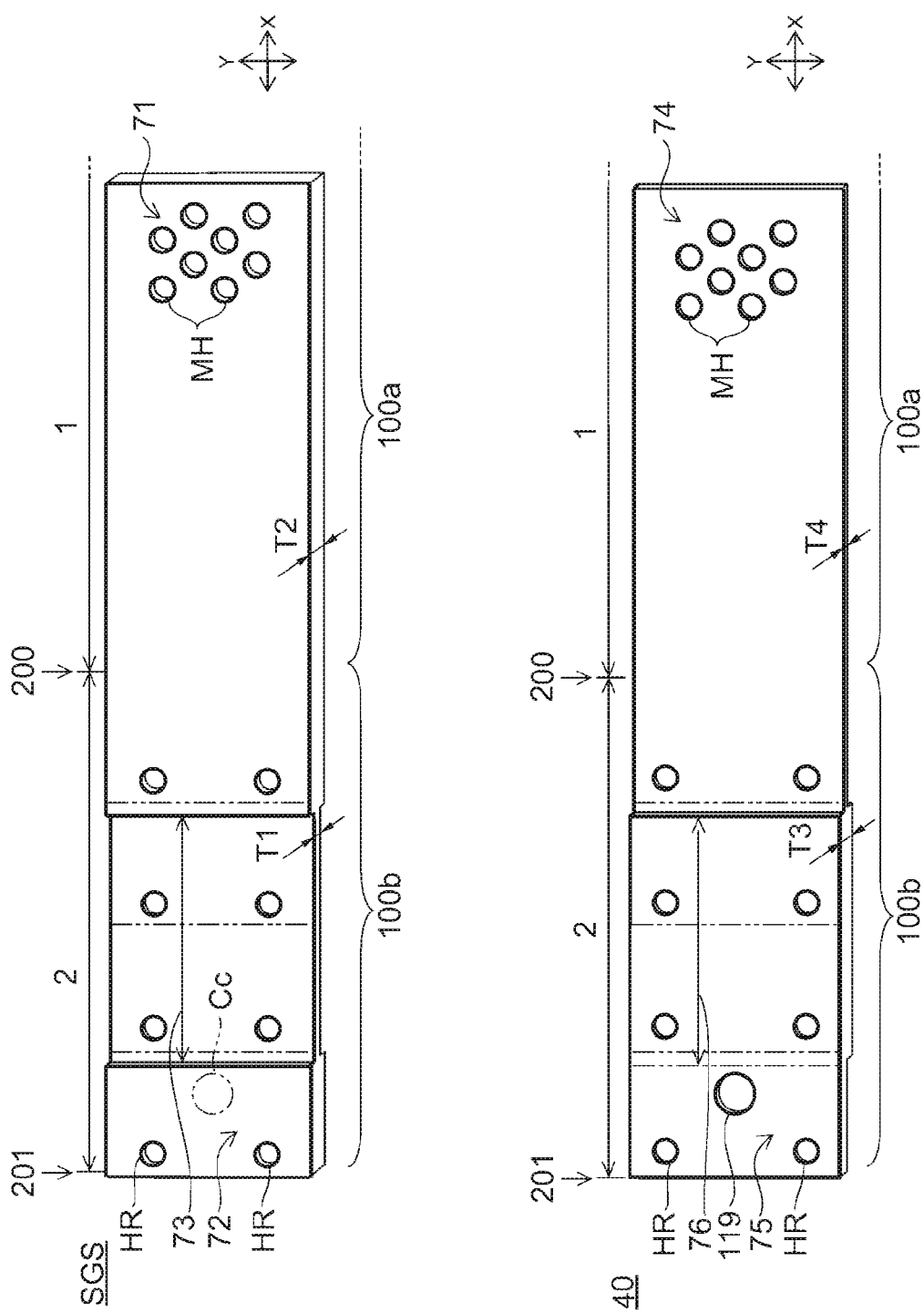

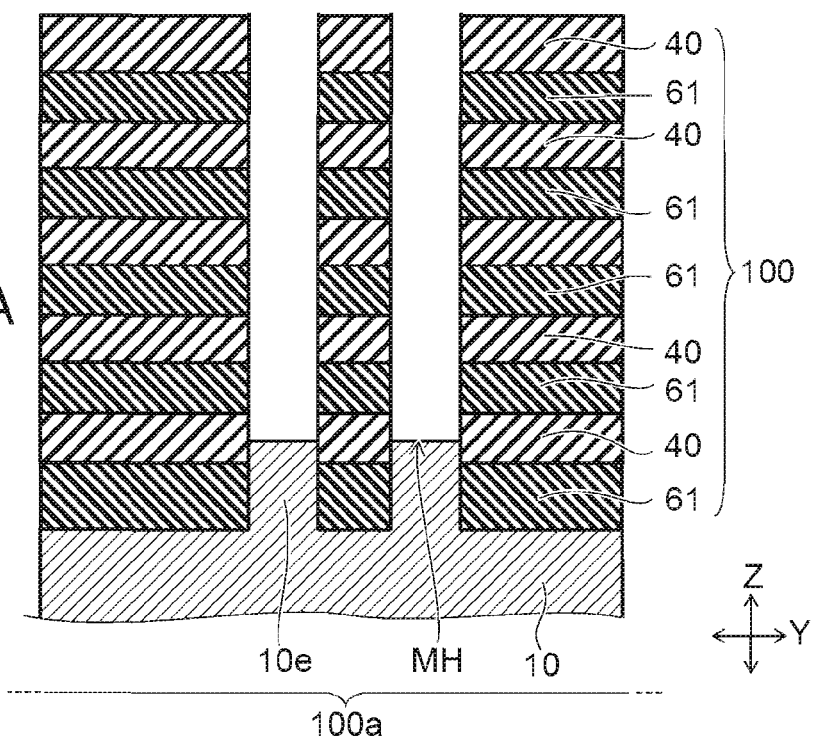
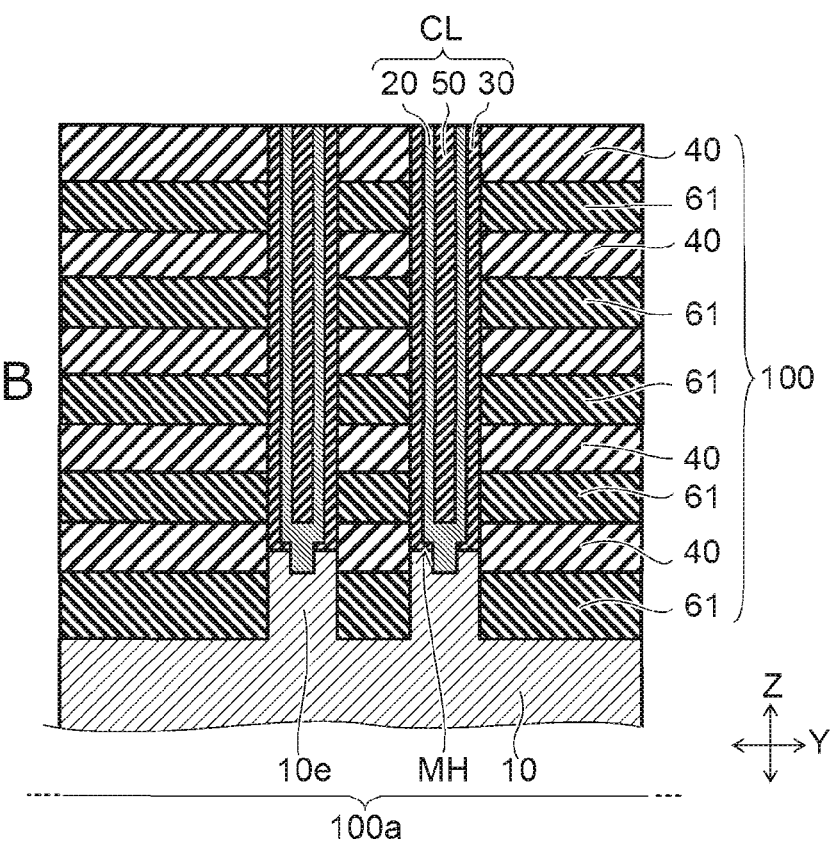

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/306,204 filed on Mar. 10, 2016; the entire contents of which are incorporated herein by reference.

FIELD

Embodiments described herein relate generally to a semiconductor device and a method for manufacturing the same.

BACKGROUND

A semiconductor device having a three-dimensional structure has been proposed in which a memory hole is made in a stacked body in which multiple electrode layers are stacked, and a charge storage film and a semiconductor film are provided to extend in a stacking direction of the stacked body inside the memory hole. In the semiconductor device of the three-dimensional structure, a stacked body alternately stacked with insulators and the electrode layers is provided on a semiconductor substrate. The electrode layer is used to form a select gate line or a word line. The stacked body includes a stacked portion and a staircase portion. The stacked portion is provided in a memory cell array. The staircase portion is provided in the staircase structure portion outside of the memory cell array. A contact of an interconnect correspond to the select gate line or the word line is provided in the staircase portion. In the original manufacturing process, the stacked body is formed on the substrate as a structure alternately stacked with the insulators and sacrifice layers. The sacrifice layers are used to form the electrode layers by replacing to a conductor. In the replacing process, a portion where the sacrifice layer is removed is used to form a space. In the memory cell array, the space is supported by a memory hole. In the staircase portion, it is supported by a support pillar. In the memory cell array, a mechanical strength of the stacked body is high. This is because the memory holes disposed are dense. In contrast, in the staircase portion, number of the support pillars is small compared with the memory holes. Thus, a mechanical strength in the staircase is low compared with a mechanical strength in the memory cell array. For example, in the case the mechanical strength is low, the insulator is warped. The warping of the insulator causes, for example, failure such as disconnection of the electrode layers. It is desirable to enhance the mechanical strength of the staircase portion of the stacked body. Furthermore, in the electrode layers, by reducing RC time constant, for example, it is desirable to improve "electric characteristic" represented by "signal response characteristic (charging and discharging characteristic)".

BRIEF DESCRIPTION OF THE DRAWINGS

FIG. 7 is a schematic plan view of an electrode layer comprised the semiconductor device of the first embodiment;

FIG. 8 is a schematic plan view of an insulator comprised the semiconductor device of the first embodiment;

FIG. 9A to FIG. 17B are schematic views showing a method for manufacturing the semiconductor device of the first embodiment;

FIG. 19 is a schematic plan view of the electrode layer comprised the semiconductor device of the second embodiment;

FIG. 20 is a schematic plan view of the insulator comprised the semiconductor device of the second embodiment;

FIG. 43 to FIG. 49B are schematic cross-sectional views showing a method for manufacturing the semiconductor device of the fifth embodiment.

DETAILED DESCRIPTION

Figure 1:
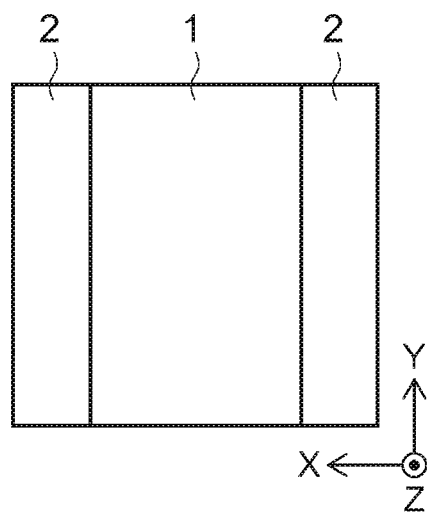
FIG. 1 is a schematic plan view showing a layout of the semiconductor device of a first embodiment.

According to the embodiment, the semiconductor device includes: a substrate; a stacked body; and a columnar portion. The stacked body is provided on the substrate. The stacked body includes a plurality of electrode layers stacked with an insulator interposed. The stacked body includes a stacked portion and a staircase portion. The staircase portion is provided outside the stacked portion. The plurality of electrode layers includes a first portion and a second portion. The first portion is provided in the staked portion. The second portion is provided in the staircase portion. The second portion is stacked in a staircase pattern in the staircase portion. The columnar portion is provided in the stacked portion of the stacked body. A plurality of columnar portions extends in a stacking direction of the stacked body. The plurality of columnar portions includes a semiconductor body extending in the stacking direction and a charge storage film. The charge storage film is provided between the semiconductor body and the plurality of electrode layers. The second portion of the electrode layers includes a third portion. A thickness of the third portion of the electrode layers along the stacking direction of the stacked body is thinner than a thickness of the first portion of the electrode layers along the stacking direction of the stacked body.

Embodiments will now be described with reference to the drawings. In the respective drawings, like members are labeled with like reference numerals. Semiconductor devices of the embodiments are semiconductor memory devices having memory cell arrays.

First Embodiment: Semiconductor Device

Figure 2:
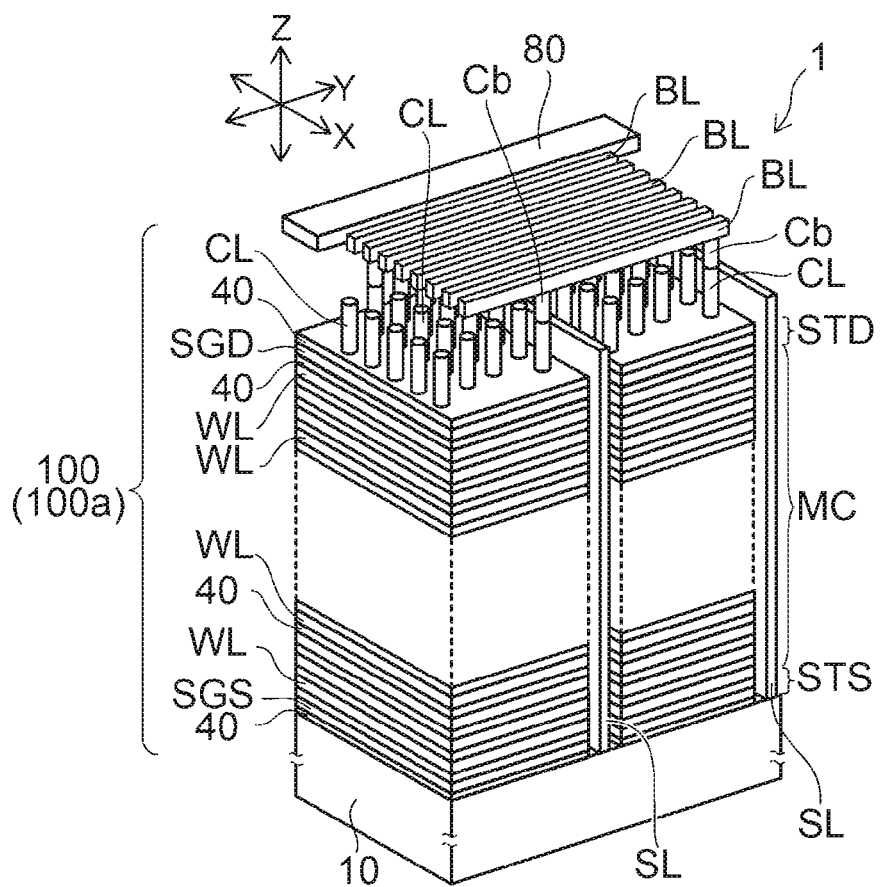
FIG. 2 is a schematic perspective view of a memory cell array of the first embodiment.
Figure 3:
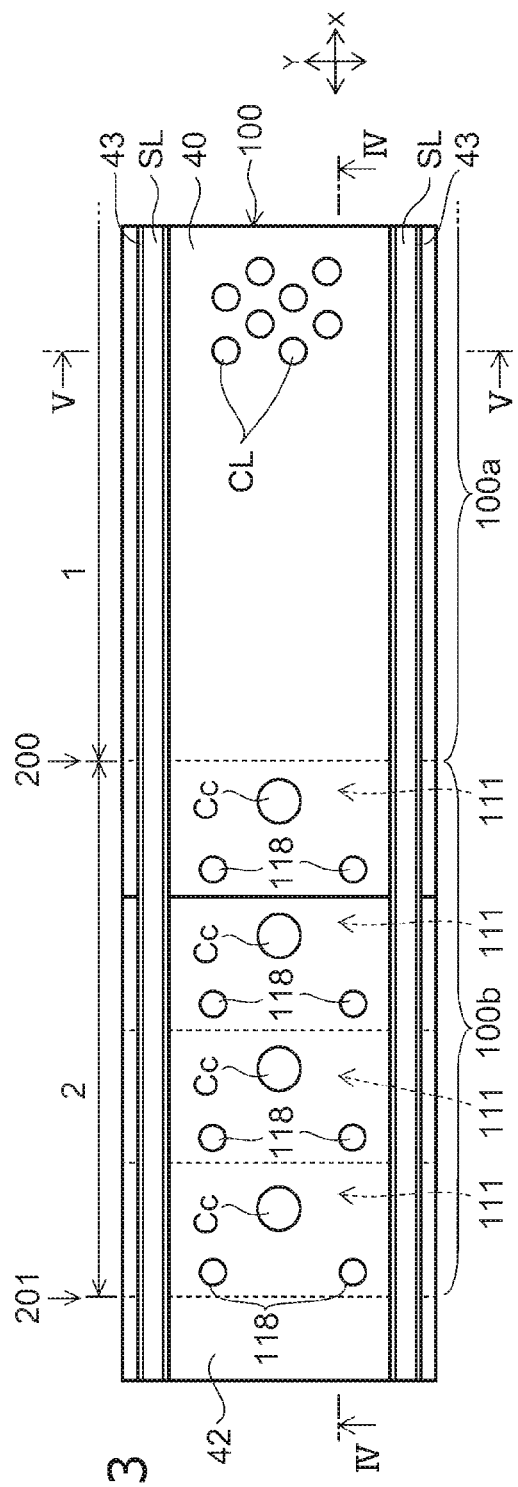
FIG. 3 is a schematic plan view of the semiconductor device of the first embodiment.
Figure 4:
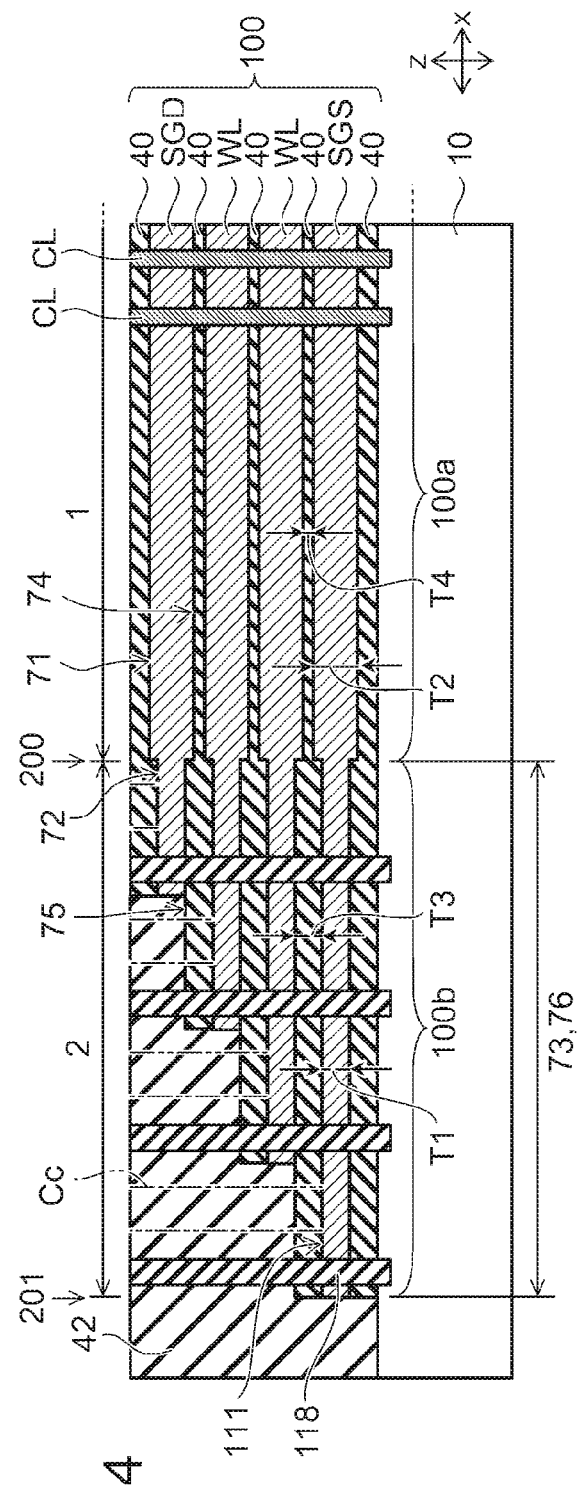
FIG. 4 is a schematic cross-sectional view along IV-IV line in FIG. 3.

FIG. 1 is a schematic plan view showing a layout of the semiconductor device of the first embodiment. FIG. 2 is a schematic perspective view of a memory cell array 1 of the semiconductor device of the first embodiment. FIG. 3 is a schematic plan view of the semiconductor device of the first embodiment. FIG. 4 is a schematic cross-sectional view along IV-IV line in FIG. 3;

In FIG. 1 to FIG. 4, two mutually-orthogonal directions parallel to a major surface of a substrate are taken as an X-direction (row direction) and a Y-direction (column direction), and a direction orthogonal to both the X-direction and the Y-direction is taken as a Z-direction (the stacking direction of the stacked body).

As shown in FIG. 1 to FIG. 4, the semiconductor device of the embodiment includes the memory cell array 1 and a staircase structure portion 2. The memory cell array 1 and the staircase structure portion 2 are, for example, provided on the major surface of the substrate 10. The staircase structure portion 2 is provided outside the memory cell array 1. The substrate 10 is, for example, a semiconductor substrate. The semiconductor substrate includes, for example, silicon. A conductivity type of the substrate 10 is, for example, p-type.

A stacked body 100 is provided on the major surface of the substrate 10. The stacked body 100 includes a plurality of electrode layers (SGD, WL, SGS) stacked with an insulator 40 interposed. Furthermore, the stacked body 100 includes a stacked portion 100*a* and a staircase portion 100*b*. The stacked portion 100*a* is provided in the memory cell array 1. The staircase portion 100*b* is provided in the staircase structure portion 2.

The electrode layers (SGD, WL, SGS) are separately stacked via the insulator 40. The electrode layer (SGD, WL, SGS) includes a conductive material. The conductive material includes, for example, tungsten. The insulators 40 may be an insulating material such as a silicon oxide film, or may be air gaps. The number of stacks of electrode layers (SGD, WL, SGS) is arbitrary.

The electrode layer SGS is a source-side select gate. The electrode layer SGD is a drain-side select gate. The electrode layer WL is a word line. The source-side select gate SGS is provided on the major surface of the substrate 10 via the insulator 40. A plurality of word lines WL is provided on the source-side select gate SGS via the insulator 40. The drain-side select gate SGD is provided on a top layer of the word lines WL via the insulator 40.

At least one of the drain-side select gates SGD is used as a gate electrode of a drain-side select transistor STD. At least one of the source-side select gates SGS is used as a gate electrode of a source-side select transistor STS. A plurality of memory cells MC is connected in series between the drain-side select transistor STD and the source-side select transistor STS. One of the word lines WL is used as a gate electrode of the memory cell MC. The structure that the drain-side select transistor STD, the plurality of memory cells MC, and the source-side select transistor STS are connected in series is called "memory string".

A columnar portion CL is provided in the stacked portion 100*a* of the stacked body 100. The columnar portion CL extends in the stacking direction of the stacked body 100 (Z-direction). The columnar portion CL is, for example, formed in a circular columnar configuration or an elliptical columnar configuration. The columnar portions CL are disposed, for example, in a staggered lattice configuration or a square lattice configuration in the memory cell array 1. The drain-side select transistor STD, the source-side select transistor STS, and the memory cell MC are provided at the columnar portion CL.

A plurality of bit lines BL is provided above the columnar portion CL. The plurality of bit lines BL extends in the column direction (Y-direction). An upper end portion of the columnar portion CL is electrically connected to one of the bit lines BL via a contact portion Cb. One bit line BL is electrically connected to the columnar portion CL selected from an each block one by one.

A source layer SL is provided in the stacked body 100. The source layer SL extends along the stacking direction (Z-direction) and the row direction (X-direction) in the stacked body 100. The source layer SL extends from the memory cell array 1 to the staircase structure portion 2. The source layer SL is separated from the stacked body 100. The source layer SL includes, for example, at least one of tungsten or titanium. The source layer SL may include, for example, titanium and titanium nitride. The source layer SL separates the stacked body 100 along the column direction (Y-direction). A plurality of regions of the stacked body 100 separated by the source layer SL is called "block".

An upper layer interconnect 80 is provided above the source layer SL. The upper layer interconnect 80 extends in the column direction (Y-direction). The upper layer interconnect 80 is electrically connected to a plurality of source lines SL separately arranged in the column direction (Y-direction). One example of a structure of the source layer SL and the columnar portion CL is shown in FIG. 5 and FIG. 6.

Figure 5:
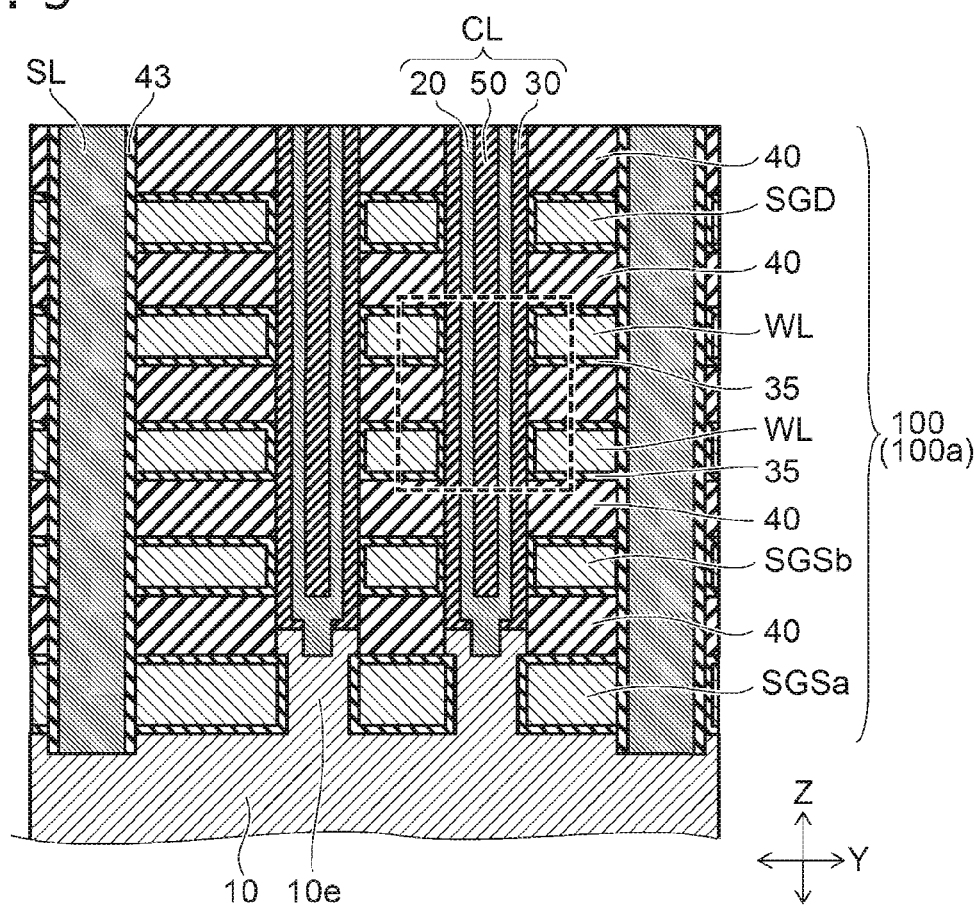
FIG. 5 is a schematic cross-sectional view along V-V line in FIG. 3.
Figure 6:
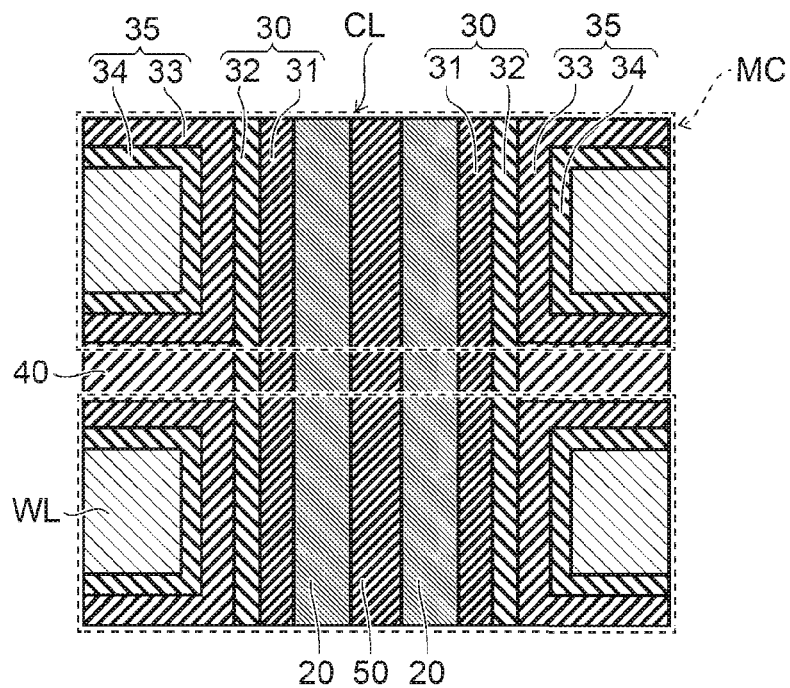
FIG. 6 is an enlarge schematic cross-sectional view of a dot line portion in FIG. 5.

FIG. 5 is a schematic cross-sectional view along V-V line in FIG. 3. FIG. 6 is an enlarged schematic cross-sectional view of a dot line portion in FIG. 5.

As shown in FIG. 5, the substrate 10 in the structure example has a protrusion portion 10*e*. The protrusion portion 10*e* is provided in the stacked portion 100*a*. An upper surface of the protrusion portion 10*e* is in contact with the columnar portion CL. A first source-side select gate SGSa is provided around the protrusion portion 10*e* via an insulator (blocking insulating film 35). In the structure example, the source-side select gate SGS includes the first source-side select gate SGSa and a second source-side select gate SGSb. The second source-side select gate SGSb is, for example, provided above the first source-side select gate SGSa.

The source layer SL is in contact with the substrate 10. Thereby, the source layer SL is electrically connected to the substrate 10. An insulating film 43 is provided between the source layer SL and the stacked portion 100a. The source layer SL is electrically isolated from the stacked body 100 by the insulating film 43. The insulating film 43 includes, for example, silicon oxide.

The columnar portion CL includes a memory film 30, a semiconductor body 20, and a core layer 50. The memory film 30, the semiconductor body 20, and the core layer 50 extend along the stacking direction of the stacked body 100 (Z-direction). The memory film 30 is provided in contact with the stacked portion 100a. A configuration of the memory film 30 is, for example, tubular. The semiconductor body 20 is provided on the memory film 30. The semiconductor body 20 includes, for example, silicon. The silicon is, for example, polysilicon made of crystallized amorphous silicon. The semiconductor body 20 is electrically connected to the substrate 10 via the protrusion portion 10e. The core layer 50 is provided on the semiconductor body 20. The core layer 50 is insulating. The core layer 50 includes, for example, silicon oxide. A configuration of the core layer 50 is, for example, columnar.

As shown in FIG. 6, the memory film 30 includes a tunneling insulating film 31 and a charge storage film 32. The charge storage film 32 is provided in contact with the stacked portion 100a. The charge storage film 32 includes, for example, silicon nitride. Other than silicon nitride, the charge storage film 32 may include a hafnium oxide. The charge storage film 32 has a trap site trapping a charge in the film. A threshold value of the memory cell MC changes depending on presence or absence of the charge trapped at the trap site and the amount of trapped charge. Thereby, the memory cell MC holds information.

The tunneling insulating film 31 is provided between the charge storage film 32 and the semiconductor body 20. The tunneling insulating film 31 includes, for example, silicon oxide or silicon oxide and silicon nitride. The tunneling insulating film 31 is a potential barrier between the charge storage film 32 and the semiconductor body 20. When a charge is injected from the semiconductor body 20 into the charge storage film 32 (writing operation) and a charge is emitted from the charge storage film 32 to the semiconductor body 20 (erasing operation), the charge tunnels through the tunneling insulating film 31.

Although not shown in FIG. 6, the memory film 30 may include, for example, a cover insulating film. The cover insulating film is provided between the charge storage film 32 and the stacked portion 100a. The cover insulating film includes, for example, silicon oxide. For example, in a replace process, the cover insulating film protects the charge storage film 32 from etching.

A blocking insulating film 35 is provided in the stacked body 100. The blocking insulating film 35 is provided between the insulator 40 and the electrode layer (SGD, WL, SGS), between the electrode layer (SGD, WL, SGS) and the memory film 30. Between the insulator 40 and the electrode layer (SGD, WL, SGS), the blocking insulating film 35 is along a plane direction of the stacked body 100 (XY plane). Between the electrode layer (SGD, WL, SGS) and the memory film 30, the blocking insulating film 35 is along the stacking direction (Z-direction). The blocking insulating film 35 includes a first blocking insulating layer 33 and a second blocking insulating layer 34.

The first blocking insulating layer 33 is provided on a side of the memory film 30 in the blocking insulating film 35. The first blocking insulating layer 33 is integrally provided from a lower end portion of the blocking insulating film 35 toward an upper end portion of the blocking insulating film 35. The second blocking insulating layer 34 is provided on a side of the electrode layer (SGD, WL, SGS) in the blocking insulating film 35. The second blocking insulating layer 34 is integrally provided along the first blocking insulating layer 33. The first blocking insulating layer 33 includes a material different from the second blocking insulating layer 34. For example, the first blocking insulating layer 33 is an insulator having a silicon oxide as a major component. The first blocking insulating layer 33 is, for example, $SiO_2$. On the other hand, the second blocking insulating layer 34 is an insulator having a metal oxide as a major component. The metal is, for example, aluminum. The second blocking insulating layer 34 is, for example, $Al_2O_3$. The first blocking insulating layer 33 has a first relative dielectric constant. The second blocking insulating layer 34 has a second relative dielectric constant higher than the first relative dielectric constant.

Although not shown in FIG. 6, a barrier film may be provided between the blocking insulating film 35 and the electrode layer (SGD, WL, SGS). The barrier film includes, for example, titanium nitride. The barrier film may include, for example, titanium and titanium nitride. Further, the blocking insulating film 35 may be provided between the charge storage film 32 and the stacked portion 100a, and extends in the stacking direction (Z-direction).

As shown in FIG. 4, an end portion of the electrode layer (SGD, WL, SGS) is disposed in the staircase structure portion 2. In the staircase structure portion 2, the end portions of the electrode layers (SGD, WL, SGS) are stacked to deviate in the staircase pattern. Thereby, the staircase portion 100b is obtained in the stacked body 100. By providing the staircase portion 100b in the stacked body 100, interconnects may be electrically connected respectively to the electrode layers (SGD, WL, SGS) stacked in the stacking direction (Z-direction). A portion including the end portion of the electrode layer (SGD, WL, SGS) and electrically connected to the interconnects is "terrace 111". An insulating layer 42 is provided above the terrace 111. The insulating film 42 includes, for example, silicon oxide.

Two support pillars 118 and one contact portion Cc are provided in each of the terraces 111. The contact portion Cc is one of electric interconnects, and is electrically connected to a peripheral circuit and the electrode layer (SGD, WL, SGS). The contact portion Cc is provided in the insulating layer 42, and extends in the stacking direction (Z-direction). In the manufacturing process of the semiconductor device, the support pillar 118 is used as a pillar supporting the insulator 40, and prevents the stacked body 100 from collapsing (about the manufacturing method is described later). The support pillar 118 is provided in the insulating film 42, and extends in the stacking direction (Z-direction). The support pillar 118 further reaches the substrate 10 via the terrace 111. A density arrangement of the support pillar 118 is, for example, lower than a density arrangement of the columnar portion CL. "density arrangement" refers, for example, number per unit of area (number/$cm^2$). Further, the number of the contact portions Cc and the number of the support pillars 118 provided in each of the terraces 111 are arbitrary.

FIG. 7 is a schematic plan view of the electrode layer comprised the semiconductor device of the first embodiment. FIG. 8 is a schematic plan view of the insulator 40 comprised the semiconductor device of the first embodiment. Although FIG. 7 and FIG. 8 are the schematic plan views, they show thicknesses of the electrode layer and the insulator 40 for convenience sake.

In FIG. 7, an example of the source-side select gate SGS of the plurality of electrode layers (SGD, WL, SGS) is shown.

As shown in FIG. 7, the source-side select gate SGS includes a first portion 71 and a second portion 72. The first portion 71 is provided in the stacked portion 100*a* of the stacked body 100. The second portion 72 is provided in the staircase portion 100*b* of the stacked body 100. In the staircase portion 100*b*, the second portion 72 is stacked in a staircase pattern. The plurality of memory holes MH is provided in the first portion 71. The memory hole MH is a hole where the columnar portion CL is provided. The plurality of holes HR is provided in the second portion 72. The hole HR is a hole where the support pillar 118 is provided. The contact portion Cc is electrically connected to the second portion 72.

The second portion 72 of the source-side select gate SGS includes a third portion 73. In the first embodiment, the third portion 73 is provided in an entire area of the source-side select gate SGS in the staircase portion 100*b*. Here, "entire area" refers, for example, an area of the source-side select gate SGS from a boundary 200 between the memory cell array 1 and the staircase structure portion 2 to an end 201 of the staircase portion 100*b*. The boundary 200 between the memory cell array 1 and the staircase structure portion 2 exists, for example, between the contact portion Cc nearest the memory cell array 1 and the columnar portion CL nearest the staircase structure portion 2. In the first embodiment, it is a portion where the thickness of the electrode layer, for example, being the source-side select gate SGS, along the stacking direction of the stacked body 100 (Z-direction) is changed. In the first embodiment, a thickness T1 of the third portion 73 of the source-side select gate SGS along the stacking direction (Z-direction) is thinner than a thickness T2 of the first portion 71 along the stacking direction of the stacked body 100 (Z-direction). Further, as it is apparent from FIG. 4, similar to the source-side select gate SGS, the drain-side select gate SGD and the word line WL also comprise the first portion 71, the second portion 72, and the third portion 73.

In FIG. 8, an example of the insulator 40 provided on the source-side select gate SGS of the plurality of insulators 40 is shown.

As shown in FIG. 8, the insulator 40 includes a fourth portion 74 and a fifth portion 75. The fourth portion 74 is provided in the stacked portion 100*a* of the stacked body 100. The fifth portion 75 is provided in the staircase portion 100*b* of the stacked body 100. In the staircase portion 100*b*, the fifth portion 75 is stacked in staircase pattern. Similar to the source-side select gate SGS, the memory hole MH is provided in the fourth portion 74. The hole HR and the hole 119 are provided in the fifth portion 75. The hole 119 is a hole where the contact portion Cc is provided.

The fifth portion 75 of the insulator 40 includes a sixth portion 76. In the first embodiment, the sixth portion 76 is provided in an entire area of the insulator 40 in the staircase portion 100*b*. Even here, "entire area" refers, for example, the area from the boundary 200 between the memory cell array 1 and the staircase structure portion 2 to the end 201 of the staircase portion 100*b*. The boundary 200 between the memory cell array 1 and the staircase structure portion 2 exists, in the first embodiment, for example, a portion where the thickness of the insulator 40 along the stacking direction (Z-direction) is changed. A thickness T3 of the sixth portion 76 of the insulator 60 along the stacking direction (Z-direction) is thicker than a thickness T2 of the fourth portion 74 along the stacking direction of the stacked body 100 (Z-direction).

In this way, in the semiconductor device of the first embodiment, the thickness T1 of the electrode layer (SGD, WL, SGS) in the staircase structure portion 2 along the stacking direction (Z-direction) is thinner than the thickness T2 in the memory cell array 1 along the stacking direction (Z-direction). Furthermore, the thickness T3 of the insulator 40 in the staircase structure portion 2 along the stacking direction (Z-direction) is thicker than the thickness T4 in the memory cell array 1 along the stacking direction (Z-direction).

According to the semiconductor device of the first embodiment like this, for example, compared to a semiconductor device being the thickness of the insulator 40 in the memory cell array 1 being equal to the thickness of the insulator 40 of in the staircase portion 100*b*, the mechanical strength in the staircase portion 100*b* of the stacked body 100 is improved. Further, compared to, for example, a semiconductor device being the thickness of the insulator 40 in the staircase structure portion 2 being thinner than the thickness of the insulator 40 in the memory cell array 1, the mechanical strength in the staircase portion 100*b* of the stacked body 100 is also improved. As a result of improving the mechanical strength of the insulator 40 in the staircase portion 100*b*, when the electrode layer (SGD, WL, SGS) is formed by the replace process, the warping of the insulator 40 in the staircase portion 100*b* may be suppressed.

Therefore, according to the first embodiment, compared to the semiconductor device being the thickness of the insulator 40 in the memory cell 1 being equal to the thickness of the insulator 40 in the staircase structure portion 2, or to the semiconductor device being the thickness of the insulator 40 in the staircase structure portion 2 being thinner than the thickness of the insulator 40 in the memory cell array 1, the semiconductor device is obtained in which the failure such as disconnection in the electrode layer (SGD, WL, SGS) is hardly occur.

Further, in the first embodiment, the thickness of the insulator 40 in the staircase structure portion 2 is thicker than the thickness of the insulator 40 in the memory cell array 1. Thus, in the staircase portion 100*b* of the stacked body 100, a distance between the electrode layer (SGD, WL, SGS) and the electrode layer (SGD, WL, SGS) along the stacking direction (Z-direction) is increased. Thus, in the staircase structure portion 2, a parasitic capacitance of the electrode layer (SGD, WL, SGS) is reduced. Therefore, according to the first embodiment, the RC time constant of the electrode layer (SGD, WL, SGS) may be also reduced.

Furthermore, in the first embodiment, the thickness of the electrode layer (SGD, WL, SGS) in the memory cell array 1 is thicker than the thickness of the electrode layer (SGD, WL, SGS) in the staircase structure portion 2. Thus, in the memory cell array 1, the resistance of the electrode layer (SGD, WL, SGS) may be reduced. In the first embodiment, the RC time constant of the electrode layer (SGD, WL, SGS) may be also reduced in the structure described above.

Therefore, in the first embodiment, for example, compared to a semiconductor device being the thickness of the insulator 40 in the memory cell array 1 being equal to the thickness of the insulator 40 in the staircase structure portion 2, or a semiconductor device being the thickness of the insulator 40 in the staircase structure portion 2 being thinner than the thickness of the insulator 40 in the memory cell array 1, for example, "electric characteristic" represented by "signal response characteristic (charging and discharging characteristic)" of the electrode layer (SGD, WL, SGS) may be improved.

First Embodiment: Manufacturing Method

Next, one example of a method for manufacturing a semiconductor device according to the first embodiment will be described.

FIG. 9A to FIG. 12A, FIG. 16A, and FIG. 17A are schematic plan views showing a method for manufacturing the semiconductor device of the first embodiment. FIG. 9B to FIG. 12B, FIG. 13 to FIG. 15, FIG. 16B, and FIG. 17B are schematic cross-sectional views showing a method for manufacturing the semiconductor device of the first embodiment. Cross-sections shown in FIG. 9B to FIG. 12B, FIG. 13 to FIG. 15, FIG. 16B, and FIG. 17B corresponds to the cross-section along B-B line in FIG. 9A.

<Forming the Stacked Body 100, and Forming the Staircase Portion 100b>

Figure 9A:
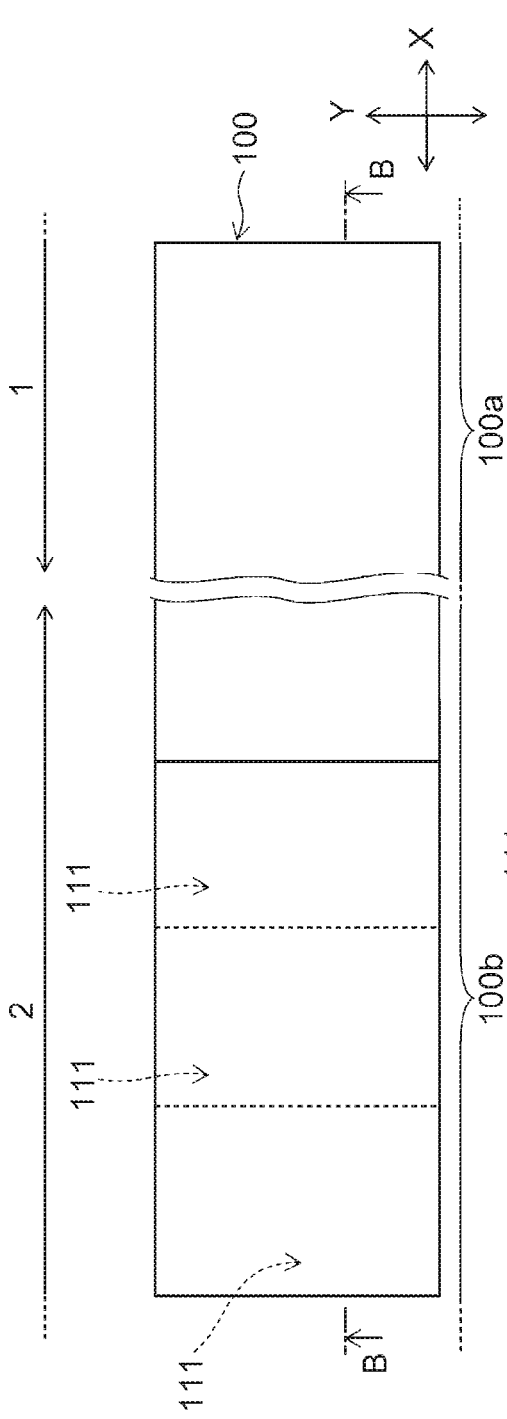
Figure 9B:
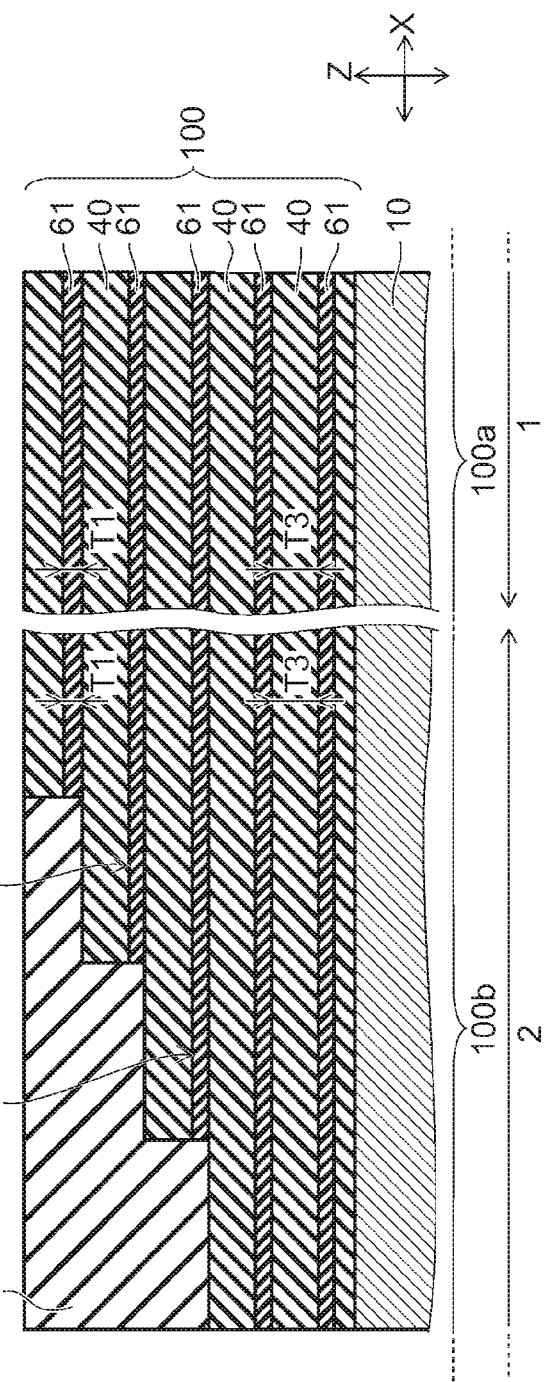

As shown in FIG. 9A and FIG. 9B, the insulators 40 and sacrifice layers 61 are alternately stacked on the substrate 10, and the stacked body 100 is formed. The sacrifice layer 61 is a layer to be replaced by the electrode layer (SGD, WL, SGS) later. A material of the sacrifice layer 61 is selected from materials different from the insulator 40, and the materials can take an etching selection ratio to the insulator 40. For example, when a silicon oxide is selected as the insulator 40, a silicon nitride is selected for the sacrifice layer 61. When the stacked body 100 is formed, a thickness of the sacrifice layer 61 is, for example, substantially equal to the thickness "T1" shown in FIG. 4 and FIG. 7. Further, the thickness of the insulator 40 is also, for example, substantially equal to the thickness "T3" shown in FIG. 4 and FIG. 8. Next, the staircase portion 100b is formed in the stacked body 100. The staircase portion 100b is, for example, formed in a step-wise by repeating alternately etching of the insulator 40 and the sacrifice layer 61 using photoresist as mask, and slimming of the photoresist. Next, the insulating layer 42 is formed on the stacked body 100 where the staircase portion 100b was formed. Next, an upper surface of the insulating layer 42 is recessed until almost coincide with an upper surface of the stacked body 100. Thereby, a recessed portion generated on the staircase portion 100b is filled by the insulating layer 42.

<Forming the Columnar Portion CL, and Forming the Support Pillar 118>

Next, as shown in FIG. 10A and FIG. 10B, the memory hole MH and the hole HR are formed in the stacked body 100. The memory hole MH is formed in the stacked portion 100a of the stacked body 100, and the hole HR is formed in the staircase portion 100b of the stacked body 100. Next, the columnar portion CL is formed in the memory hole MH. The columnar portion CL is formed in the memory hole MH after forming process of the memory film 30, forming process of the semiconductor body 20, and forming process of the core layer 50. In the forming process of the memory film 30, an insulating film including the charge storage film 32 is formed on the stacked body 100. The insulating film is used as the memory film 30. Next, in the memory hole MH, a bottom portion of the insulating film is removed, and the substrate 10 is exposed from a bottom of the memory hole MH. Thereby, the memory film 30 being the tubular configuration is formed in the memory hole MH. In the forming process of the semiconductor body 20, a semiconductor film used as the semiconductor body 20 is formed on the stacked body 100 where the memory film 30 was formed. Thereby, the semiconductor body 20 is formed in the memory hole MH. In the forming process of the core layer 50, an insulating film used as the core layer 50 is formed on the stacked body 100 where the semiconductor body 20 was formed, and the insulating film used as the core layer 50 is filled in the memory hole MH. Thereby, the core layer 50 is formed in the memory hole MH. Here, in the embodiment, the memory hole MH and the hole HR are simultaneously formed. Thus, in the hole HR, the support pillar 118 having a structure similar to the columnar portion CL is formed. Of course, the memory hole MH and the hole HR may be different processes. In this case, the hole HR is filled by an insulating material. The support pillar 118 is formed to include an insulating material being, for example, silicon oxide.

In one terrace 111, an interval between adjacent the holes HR is "D1". In adjacent the terraces 111, it is "D2". Further, minimum interval between adjacent the memory holes MH is "D3". The relationship among these intervals is, for example, $$D2 > D1 > D3.$$

In the case these arrangements, the density arrangement of the support pillar 118 is, for example, lower than the density arrangement of the columnar portion CL.

<Forming the Slit ST and Forming the Space 61r>

Next, as shown in FIG. 11A and FIG. 11B, the slit ST is formed in the stacked body 100. The slit ST extends from the memory cell array 1 to the staircase structure portion 2 along the X-direction. Next, the sacrifice layer 61 is removed from the stacked body 100 via the slit ST. For example, wet etching method using hot phosphoric acid is used as the method removing the sacrifice layer 61. Thereby, a space 61r is formed between the insulator 40 and the insulator 40.

At this time, as shown in FIG. 10A, the distance D2 or the distance D3 between adjacent the support pillars 118 is longer than the distance D1 between adjacent the columnar portion CL. In other words, mechanical strength of the insulator 40 in the staircase portion 100b is lower than the insulator 40 of the stacked portion 100a. Thus, when the sacrifice layer 61 is removed, compared to the insulator 40 in the stacked portion 100a, the insulator 40 in the staircase portion 100b is susceptible to surface tension by chemical solution or to film stress of the insulator 40 itself. In other words, the insulator 40 in the staircase portion 100b is easy to warp compared with the insulator 40 in the stacked portion 100a.

When the warping of the insulator 40 is large, the fluctuation of the thickness of the electrode layer (SGD, WL, SGS) formed in the space 61r described below along the stacking direction (Z-direction) is increased. When the fluctuation of the thickness is increased, the likelihood of increasing parasitic capacitance or causing disconnection of the electrode layer (SGD, WL, SGS) is high. In the staircase portion 100b, as one method suppressing the warp of the insulator 40, for example, the method enlarging a diameter of the support pillar 118 is considered. However, a region where the contact portion Cc is formed described below is narrow. Thereby, the likelihood of causing failure of contact between the contact portion Cc and the electrode layer (SGS, WL, SGD) is high. In contrast, when the region where the contact portion Cc is formed is expanded, the downscaling is prevented.

In this respect, in the first embodiment, the thickness T3 of the insulator 40 in the staircase structure portion 2 along the stacking direction (Z-direction) is thicker than the thickness T4 of in the stacked portion 100a along the stacking direction (Z-direction) of the memory cell array 1. Thus, the mechanical strength of the insulator 40 is higher in the staircase portion 100b than the stacked portion 100a. Therefore, in the first embodiment, the large warping of the insulator 40 in the staircase portion 100b may be suppressed.

<Forming the Filling Member 65>

Figure 12A:
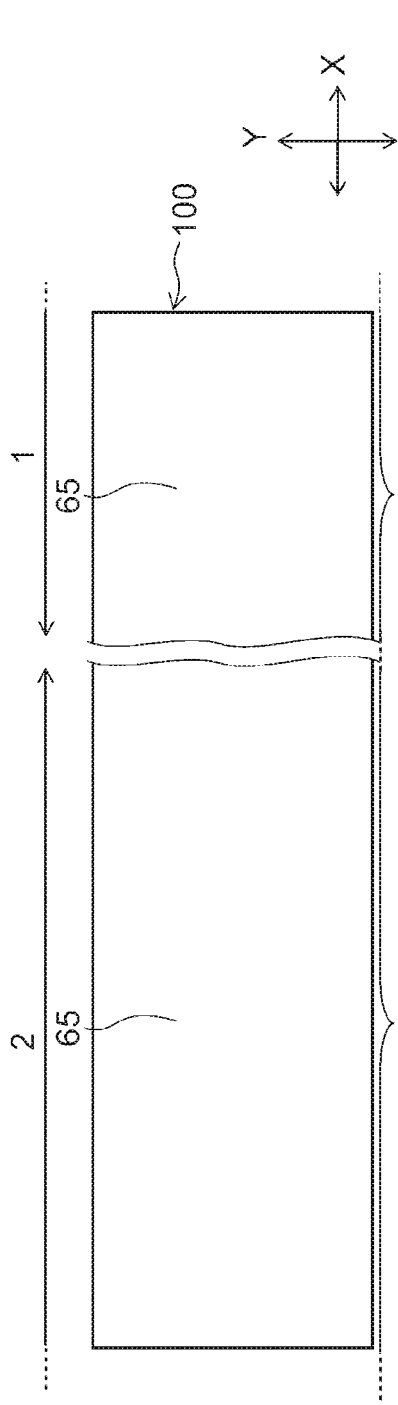
Figure 12B:
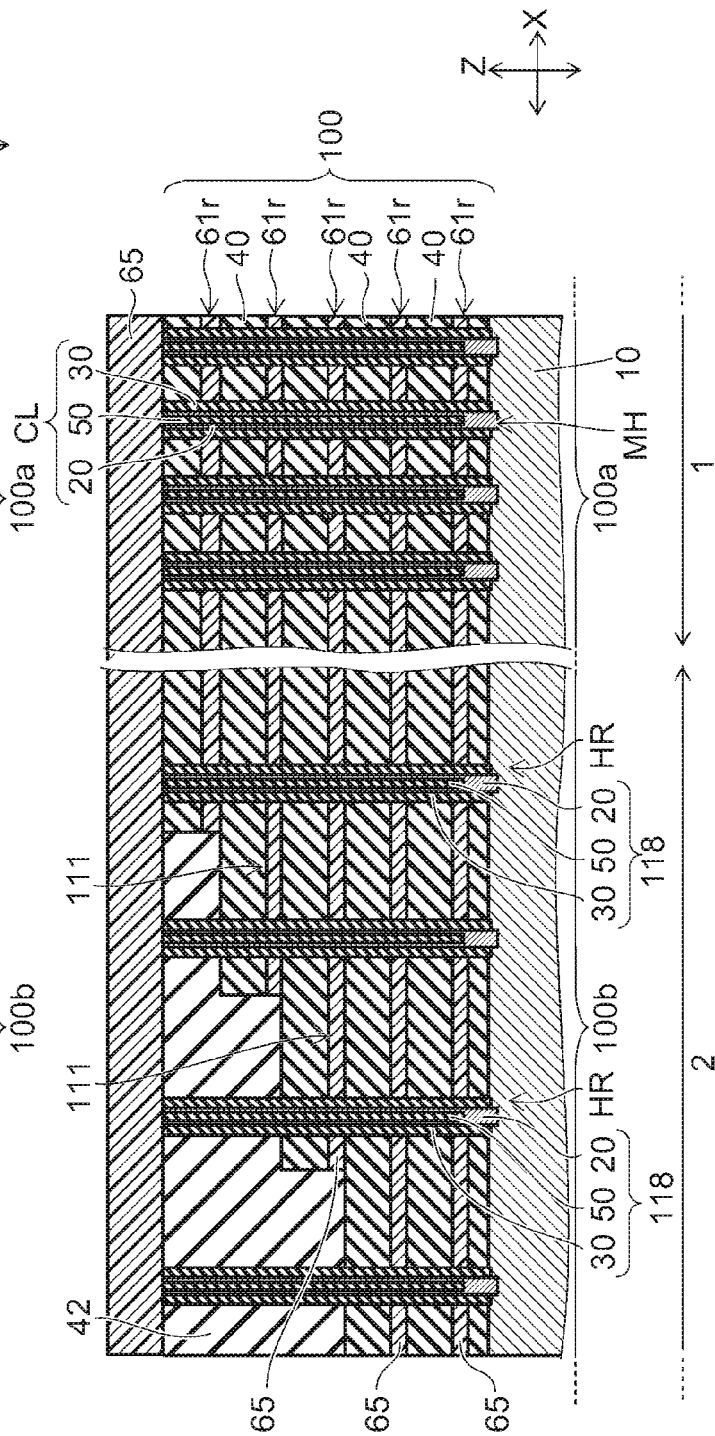

Next, as shown in FIG. 12A and FIG. 12B, a filling member 65 is filled in the space 61r. The filling member 65 is, for example, negative photoresist.

<Exposing the Filling Member 65>

Next, as shown in FIG. 13A and FIG. 13B, the filling member 65 is exposed. The filling member 65 is negative photoresist. In the negative photoresist, a portion exposed by irradiating light is, for example, insoluble or difficulty soluble in developer. In the first embodiment, the filling member 65 in an entire area of the staircase portion 100b is irradiated light in order to remain the filling member 65 in an entire area of the stacked portion 100b. The insulating layer 42 and the insulator 40 include, for example, silicon oxide. The silicon oxide can, for example, transmit light. Thus, the filling member 65 may be exposed from an upper portion of the stacked body 100 to a bottom portion of the stacked body 100.

<Developing the Filling Member 65 (Filling the Space 61r in the Staircase Portion 100b>

Next, as shown in FIG. 13A and FIG. 13B, the filling member 65 is developed. In the developing process, a portion where the filling member 65 is not exposed is removed via the slit ST. As a result, the filling member 65 is remained in the space 61r in the staircase portion 100b. Thereby, the space 61r in the staircase portion 100b is filled by the filling member 65.

<Expanding the Space 61r>

Figure 14:
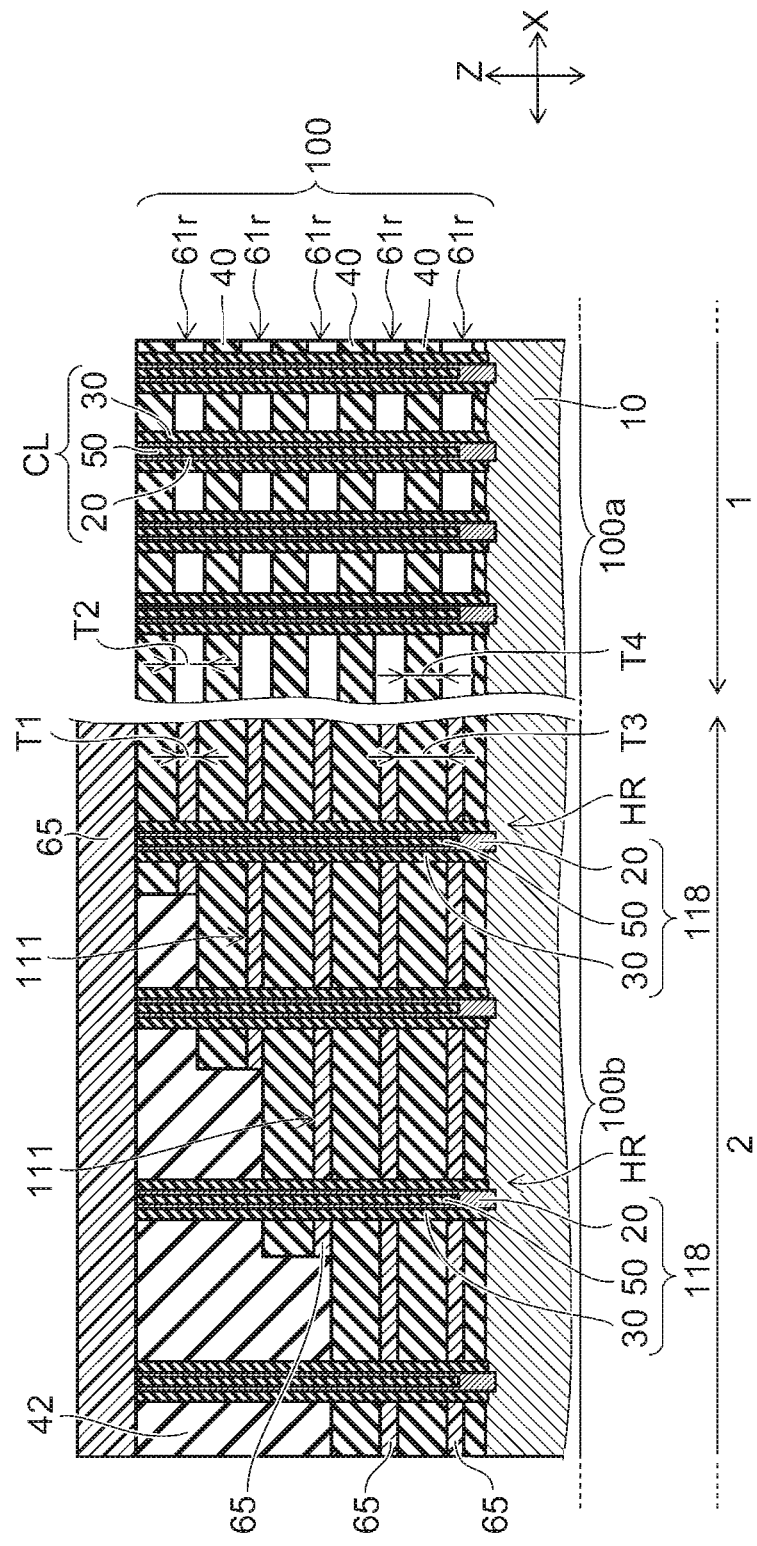

Next, as shown in FIG. 14, the insulator 40 is etched using the filling member 65 as mask. Thereby, the space 61r is expanded. In the memory cell array 1 (the stacked portion 100a), a thickness of the space 61r along the stacking direction (Z-direction) is expanded until to be substantially equal to the thickness "T2" shown in FIG. 4 and FIG. 7. Simultaneously, in the memory cell array 1 (the stacked portion 100a), the thickness of the insulator 40 along the stacking direction (Z-direction) is reduced until to be substantially equal to the thickness "T4" shown in FIG. 4 and FIG. 8. In a portion where the filling member 65 is remained, the insulator 40 is not etched. Therefore, the thickness of the insulator 40 is not changed.

<Removing the Filling Member 65>

Figure 15:
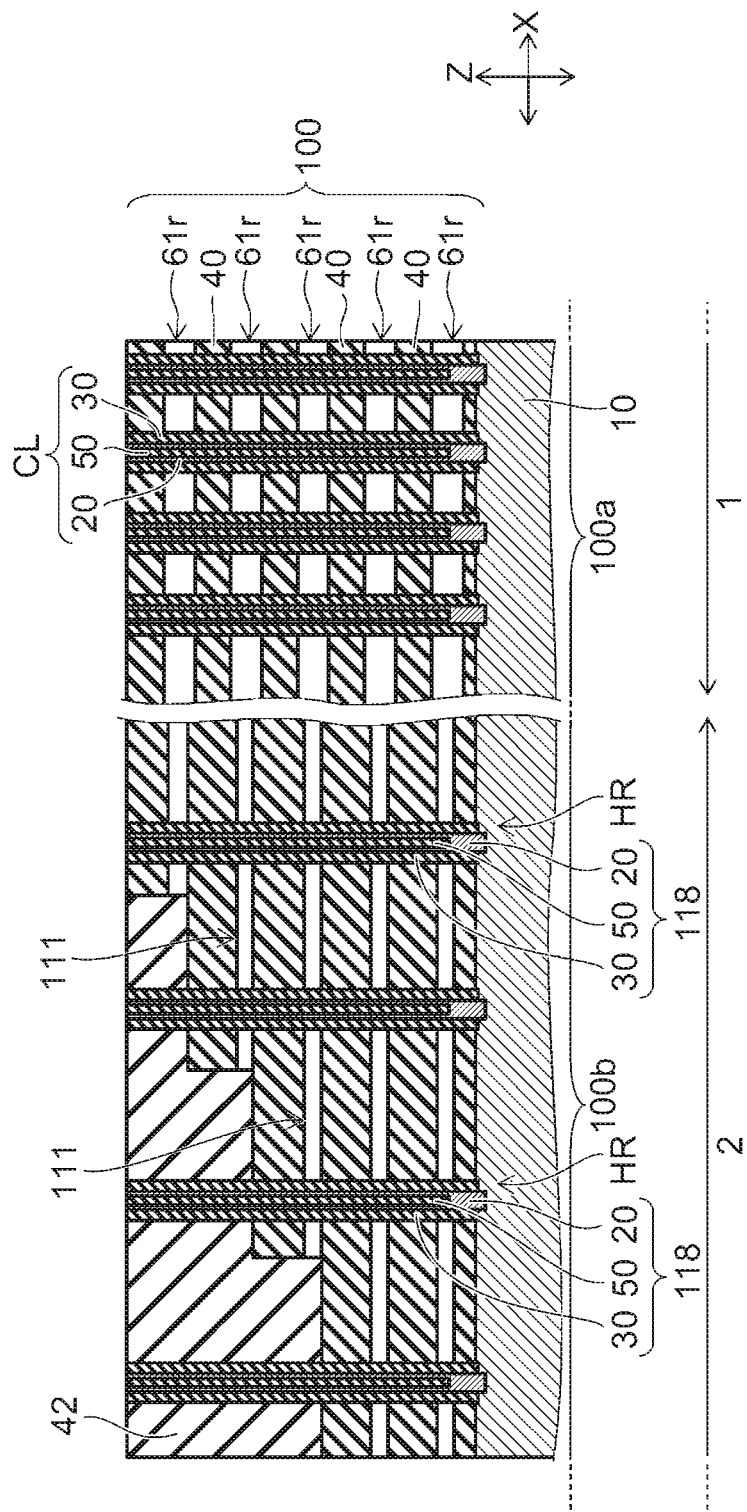
Figures 16A, 16B:
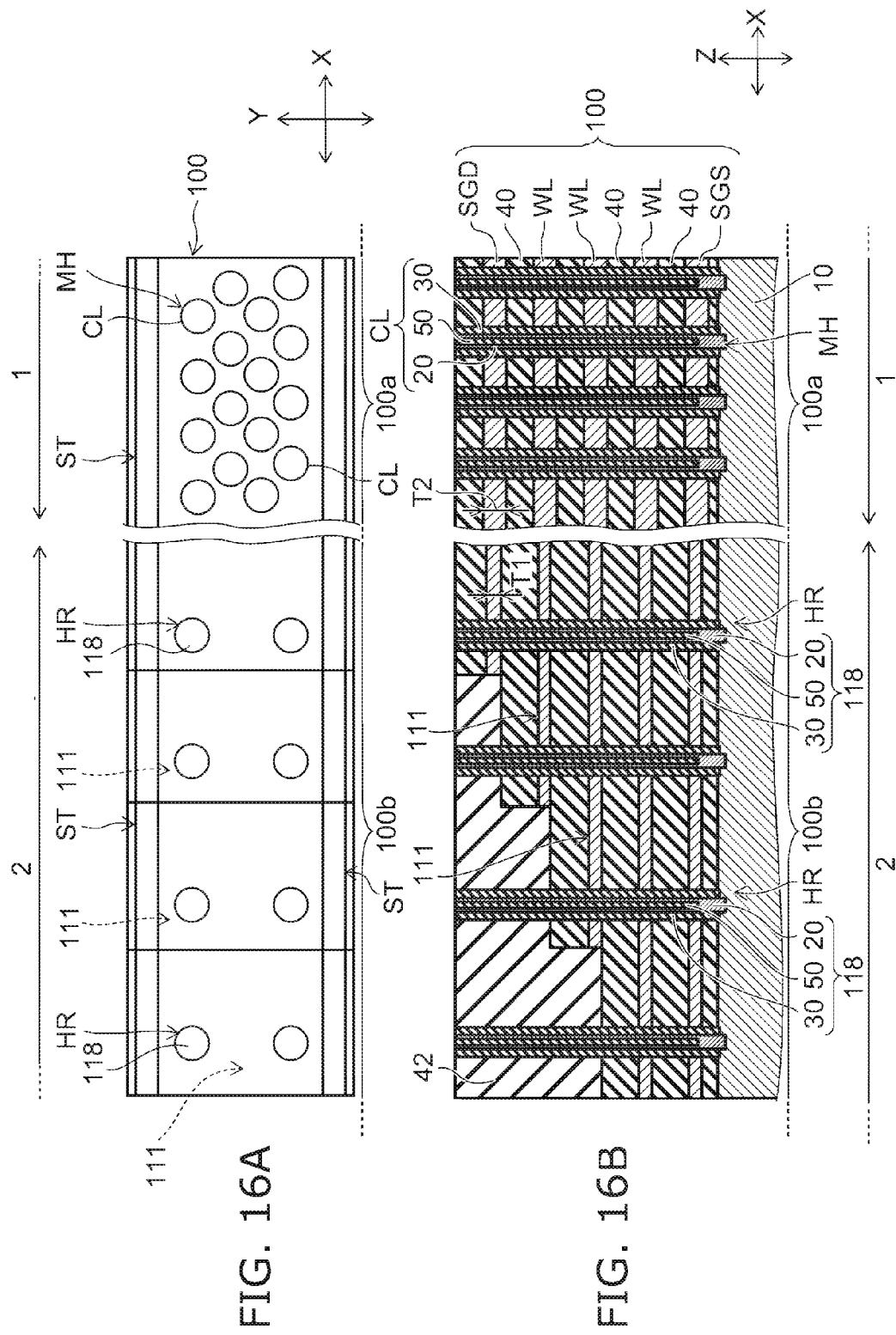

Next, as shown in FIG. 15, the filling member 65 is removed from the space 61r in the staircase portion 100b. The removing of the filling member 65 is, for example, performed via the slit ST shown in FIG. 11A.

<Forming the Electrode Layer (SGD, WL, SGS)>

Next, as shown in FIG. 16, the space 61r is filled by the conductive material via the slit ST. Thereby, the electrode layer (SGD, WL, SGS) is formed between the insulators 40. Here, in the recessing process of the insulator 40 (expanding the space 61r), the thickness T2 of the electrode layer (SGD, WL, SGS) in the stacked portion 100a may be set to arbitrary by adjusting the etching amount. In other words, the thickness of the electrode layers (SGD, WL, SGS) in the stacked portion 100a may be increased to the utmost; and the thickness of the electrode layer (SGD, WL, SGS) in the staircase portion 100b may be reduced to the utmost. Thereby, it may be simultaneously possible to satisfy the reducing of the resistance of the electrode layer (SGD, WL, SGS) in the stacked portion 100a and the reducing of the parasitic capacitance of the electrode layer (SGD, WL, SGS) in the staircase portion 100b.

<Forming the Source Layer and Forming the Contact Portion>

Next, as shown in FIG. 17, the conductive material formed in the slit ST is removed. Next, the insulating film 43 is formed in the slit ST. Next, the insulating film 43 is removed from a bottom of the slit ST. Thereby, the substrate 10 is exposed in the bottom of the slit ST. Next, the slit ST is filled by the conductive material. Thereby, the source layer SL is formed in the slit ST. The source layer SL is electrically connected to the substrate 10 via the bottom of the slit ST. Next, in the staircase portion 100b, the contact portion Cc is formed. The contact portion Cc is electrically connected to the electrode layer (SGD, WL, SGS) via the insulating layer 42, the insulator 40, and the terrace 111. After that, for example, as shown in FIG. 2, the bit line BL, and the upper layer interconnect 80 and so on are formed on the stacked body 100.

For example, the semiconductor device of the first embodiment can be manufactured by such a manufacturing method.

Second Embodiment: Semiconductor Device

Figure 18:
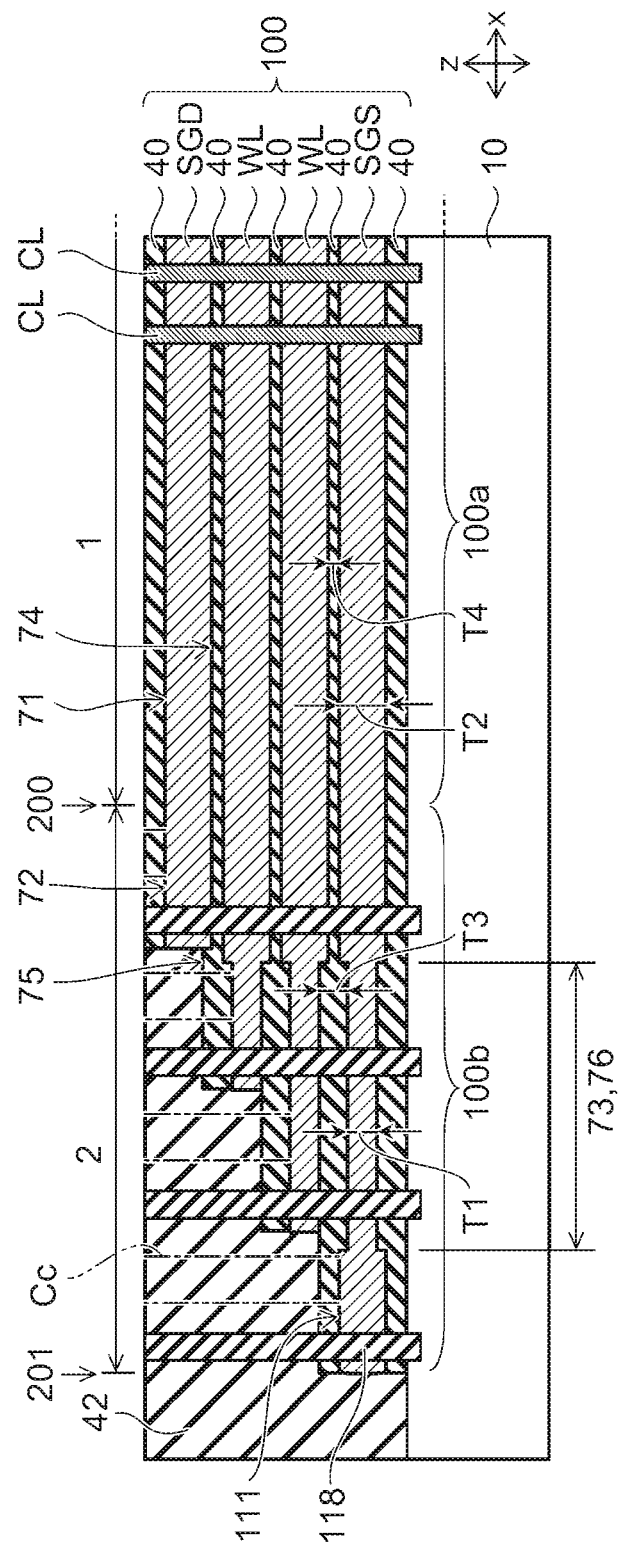
FIG. 18 is a schematic cross-sectional view of the semiconductor device of a second embodiment.

FIG. 18 is a schematic cross-sectional view of the semiconductor device of a second embodiment. A cross-section shown in FIG. 18 corresponds to the cross-section shown in FIG. 4. FIG. 19 is a schematic plan view of the electrode layer comprised the semiconductor device of the second embodiment. FIG. 20 is a schematic plan view of the insulator 40 comprised the semiconductor device of the second embodiment.

As shown in FIG. 18 to FIG. 20, the semiconductor device of the second embodiment is different from the semiconductor device of the first embodiment in that the third portion 73 of the electrode layer (SGD, WL, SGS) is provided in a part of the staircase portion 100b of the stacked body 100. In the second embodiment, the sixth portion 76 of the insulator 40 is also provided in the part of the staircase portion 100b of the stacked body 100.

The third portion 73 of the electrode layer (SGD, WL, SGS) and the sixth portion 76 of the insulator 40 may be provided in the part of the staircase portion 100b, although not provided in the entire area of the staircase portion 100b.

Also in the second embodiment, the insulator 40 comprises the sixth portion 76 in the staircase structure portion 2. Therefore, in the second embodiment, similar to the first embodiment, the mechanical strength of the insulator 40 in the staircase portion 100b may be improved.

Further, the insulator 40 comprises the sixth portion 76, furthermore, the electrode layer (SGD, WL, SGS) comprises the third portion 73 in the staircase structure portion 2. Thus, similar to the first embodiment, the parasitic capacitance of the electrode layer (SGD, WL, SGS) is also reduced in the staircase structure portion 2. Therefore, in the second embodiment, the RC time constant of the electrode layer (SGD, WL, SGS) may be reduced.

Further, the thickness T2 of the electrode layer (SGD, WL, SGS) in the memory cell array 1 is thicker than the thickness T1 in the staircase structure portion 2. Thus, the resistance of the electrode layer (SGD, WL, SGS) may be reduced in the memory cell array 1. Also from this point of view, in the second embodiment, the RC time constant of the electrode layer (SGD, WL, SGS) may be reduced.

Second Embodiment: Manufacturing Method

Next, one example of a method for manufacturing a semiconductor device according to the second embodiment will be described.

FIG. 21 to FIG. 25 are schematic cross-sectional views showing a method for manufacturing the semiconductor device of the second embodiment. Cross-sections shown in FIG. 21 to FIG. 25 correspond to the cross-section shown in FIG. 18.

<Forming the Slit ST, and Forming the Space 61r>

Figure 21:
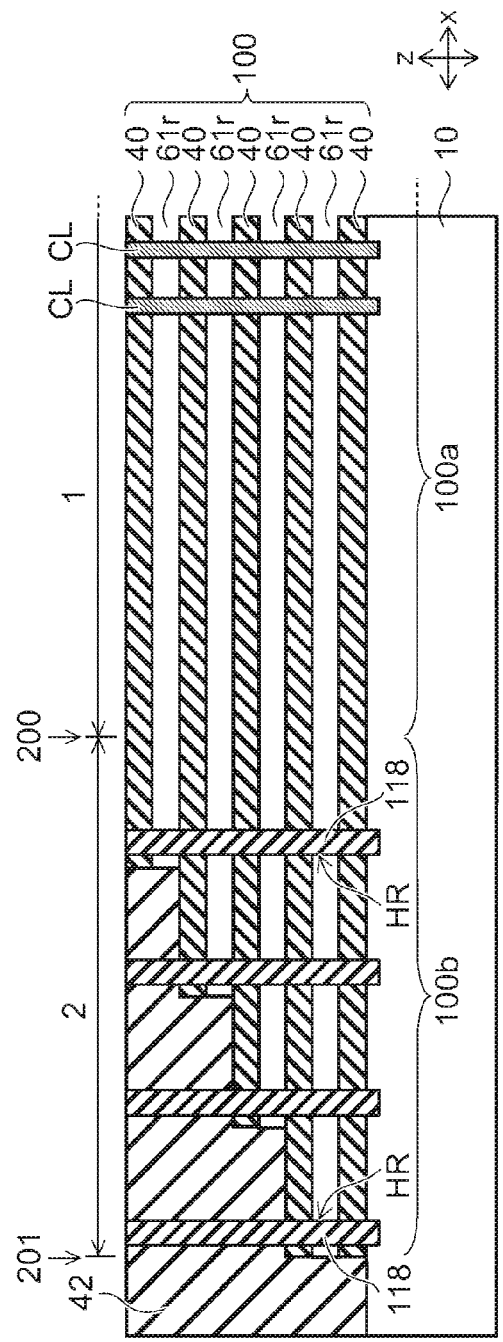
FIG. 21 to FIG. 25 are schematic cross-sectional views showing a method for manufacturing the semiconductor device of the second embodiment.

For example, according to the method for manufacturing described with reference to FIG. 9A to FIG. 11B, a structure shown in FIG. 21 is achieved. In FIG. 21, by forming the slit ST in the stacked body 100 including the sacrifice layer 61, and removing the sacrifice layer 61 via the slit ST, the state where the space 61r is formed in the stacked body 100 is showed. Here, the sacrifice layer 61 and the slit ST are not shown in FIG. 21. With respect to the sacrifice layer 61, for example, see FIG. 10B. With respect to the slit ST, for example, see FIG. 11A.

<Forming the Filling Member 65>

Figure 22:
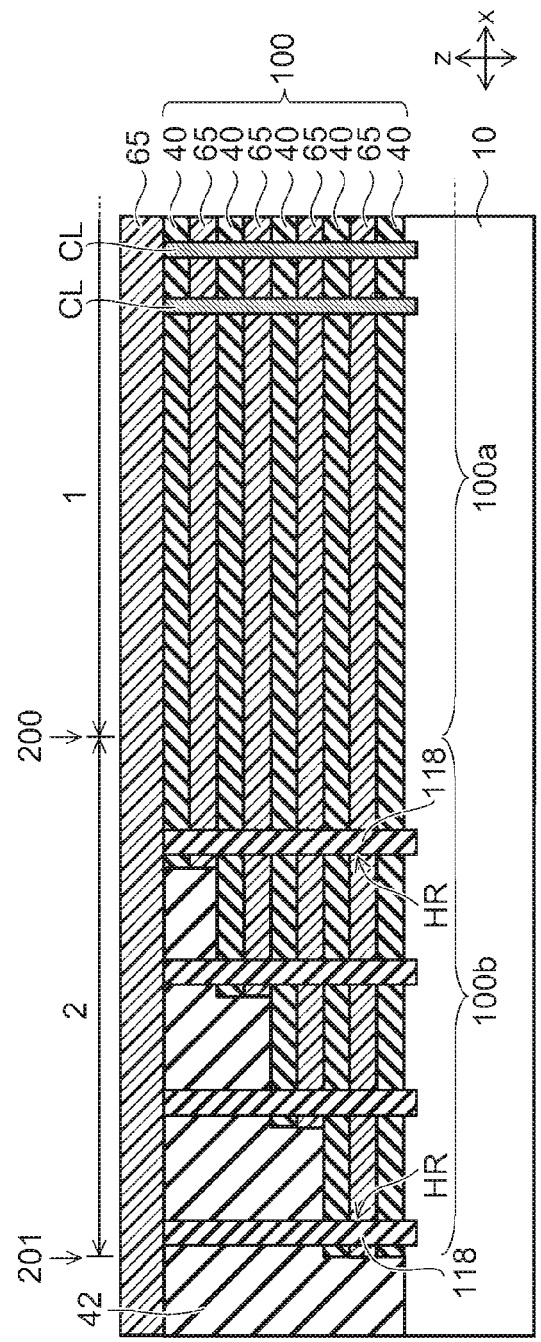

Next, as shown in FIG. 22, the filling member 65 is filled in the space 61r via the slit ST. Similar to the first embodiment, the filling member 65 is, for example, negative photoresist.

<Exposing the Filling Member 65>

Figure 23:
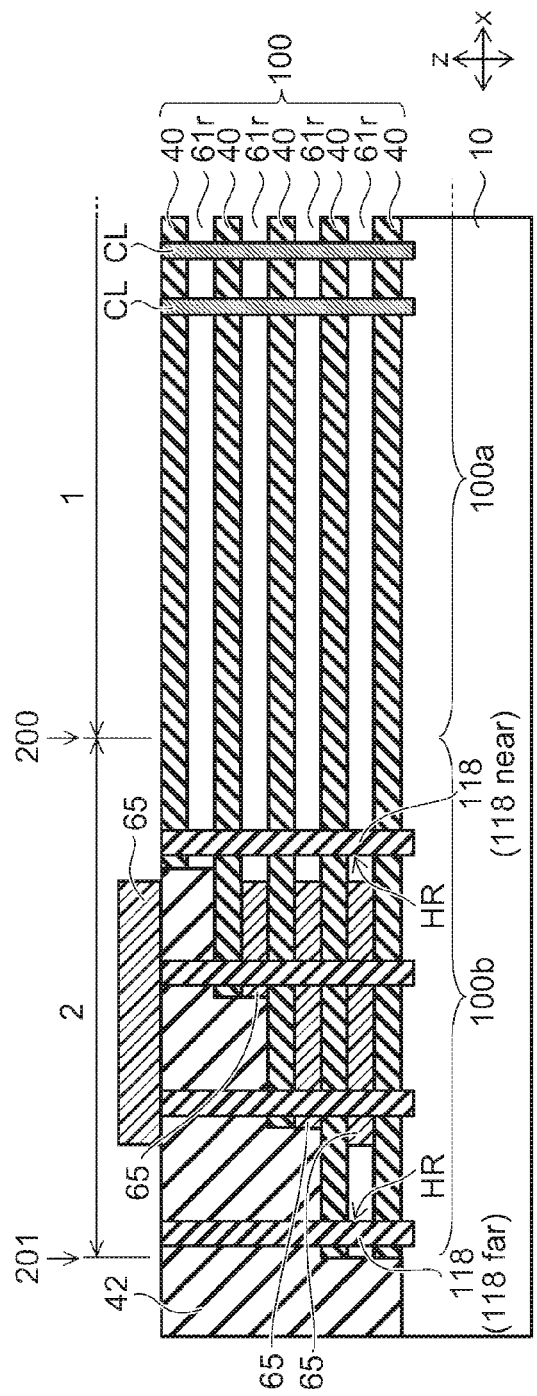

Next, as shown in FIG. 23, the filling member 65 is exposed. In the second embodiment, the filling member 65 is exposed in order to remain the filling member 65 in a part of the staircase portion 100b. For example, in the second embodiment, according to an example of a portion of the staircase portion 100b, the filling member 65 is remained in the region separated from the boundary 200 and the end 201 of the staircase portion 100b. The boundary 200 exists between the memory cell array 1 and the staircase structure portion 2. For example, specifically, for example, the filling member 65 is remained in a region between the support pillar 118 near and a hole 118 far, the support pillar 118 near being nearest to the memory cell array 1, and the hole 118 far being farthest to memory cell array 1. Here, the filling member 65 may be further to at least one of the boundary 200 or the end 201, although being not further to both of the boundary 200 and the end 201. Also in this case, the filling member 65 is remained in the portion of the staircase portion 100b. Therefore, the third portion 73 of the electrode layer (SGD, WL, SGS) may be formed in the part of the staircase portion 100b. Similarly, the sixth portion 76 of the insulator 40 may be formed in the part of the staircase portion 100b.

<Developing the Filling Member 65>

Next, as shown in FIG. 23, the filling member 65 is developed. Thereby, a part of the filling member 65 is remained in the space 61r of the staircase portion 100b, and the filling member 65 is removed from the space 61r.

<Expanding the Space 61r>

Figure 24:
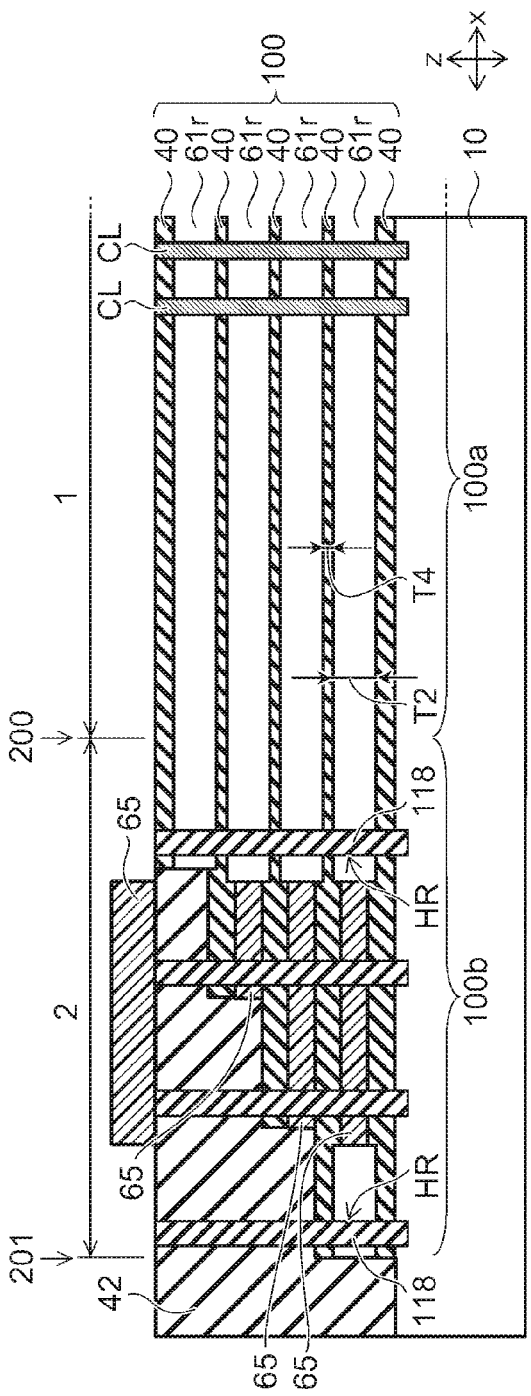

Next, as shown in FIG. 24, the insulator 40 is etched using the filling member 65 as mask, and the space 61r is expanded. Thereby, in the memory cell array 1 (stacked portion 100a), the thickness of the space 61r along the stacking direction (Z-direction) is substantially equal to the thickness "T2" shown in FIG. 4 and FIG. 7. Further, in the memory cell array 1 (stacked portion 100a), the thickness of the insulator 40 along the stacking direction (Z-direction) is substantially equal to the thickness "T4" shown in FIG. 4 and FIG. 8.

<Removing the Filling Member 65>

Figure 25:
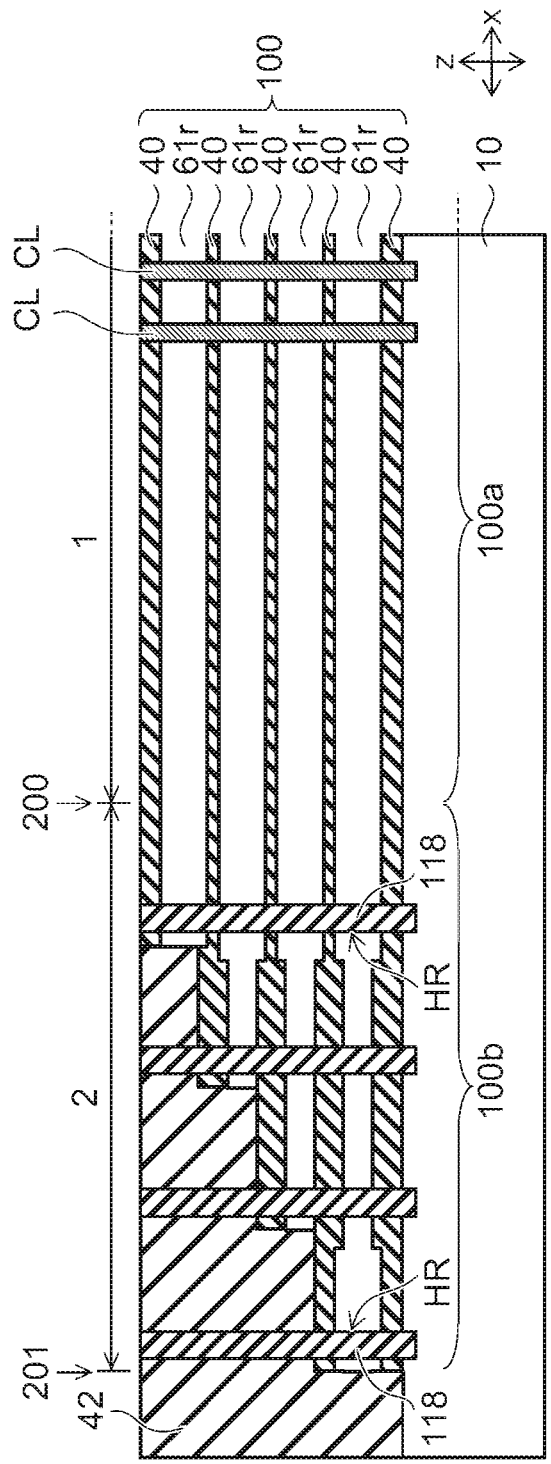

Next, as shown in FIG. 25, the filling member 65 is removed from the space 61r via the slit ST not shown.

<Forming the Electrode Layer (SGD, WL, SGS)>

Next, as shown in FIG. 18, the conductive material is filled in the space 61r via the slit ST not shown. Thereby, the electrode layer (SGD, WL, SGS) is formed between the insulators 40. After that, the insulating film 43 and the source layer SL are formed in the slit ST not shown. Next, the contact portion Cc is formed in the staircase portion 100b. Next, the bit line BL not shown, and the upper layer interconnect 80 and so on are formed on the stacked body 100.

For example, the semiconductor device of the second embodiment can be manufactured by such a manufacturing method.

Third Embodiment: Semiconductor Device

Figure 26:
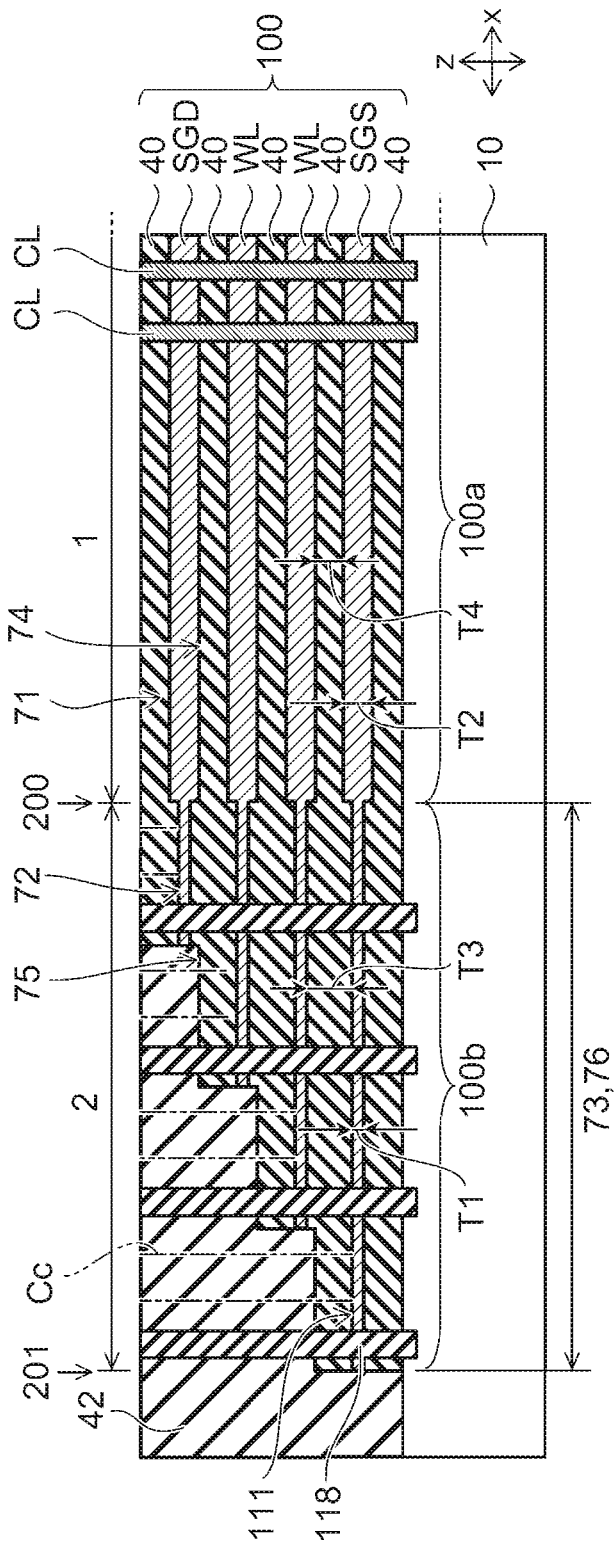
FIG. 26 is a schematic cross-sectional view of the semiconductor device of a third embodiment.

FIG. 26 is a schematic cross-sectional view of the semiconductor device of a third embodiment. A cross-section shown in FIG. 26 corresponds to the cross-section shown in FIG. 4.

As shown in FIG. 26, the semiconductor device of the third embodiment is different from the semiconductor device of the first embodiment in a relationship of a difference between the thickness T1 of the electrode layer (SGD, WL, SGS) and the thickness T3 of the insulator 40 in the staircase portion 100b "T1−T3=|ΔT100b|", and of a difference between the thickness T2 of the electrode layer (SGD, WL, SGS) and the thickness T4 of the insulator 40 in the stacked portion 100a "T2−T4=|ΔT100a|".

For example, in the first embodiment, as is apparent from the description of FIG. 4, film thickness difference |ΔT100a|>film thickness difference |ΔT100b|.

In the first embodiment, the thickness of the electrode layer (SGD, WL, SGS) in the staircase portion 100b is close to the thickness of the insulator 40 than in the stacked portion 100a.

In contrast, in contradiction to the first embodiment, in the third embodiment film thickness difference |ΔT100a|<film thickness difference |ΔT100b|.

In the third embodiment, the thickness of the electrode layer (SGD, WL, SGS) in the stacked portion 100a is close to the thickness of the insulator 40 than in the staircase portion 100b. It is.

Thus, the relationship of the film thickness difference |ΔT100b| and the film thickness difference |ΔT100a| may be |ΔT100a|<|ΔT100b|.

Also in the third embodiment, such the insulator 40 comprises the sixth portion 76 in that the thickness T3 in the staircase structure portion 2 is thicker than the thickness T4 in the memory cell array 1. Therefore, similar to the first, the second embodiment, the mechanical strength of the insulator 40 is improved in the staircase structure portion 2.

Further, the electrode layer (SGD, WL, SGS) comprises the third portion 73 in that the thickness T1 in the staircase structure portion 2 is thinner than the thickness T2 in the memory cell array 1. Furthermore, the thickness T2 of the electrode layer (SGD, WL, SGS) is thicker than the thickness T1. Thereby, the RC time constant of the electrode layer (SGD, WL, SGS) is, similar to the first, the second embodiment, may be reduced. Therefore, similar to the first, the second embodiment, also in the third embodiment, for example, "electric characteristic" represented by "signal response characteristic (charging and discharging characteristic)" of the electrode layer (SGD, WL, SGS) may be increased.

Third Embodiment: Manufacturing Method

Next, one example of a method for manufacturing a semiconductor device according to the third embodiment will be described.

FIG. 27 to FIG. 30 are schematic cross-sectional views showing a method for manufacturing the semiconductor device of the third embodiment. Cross-sections shown in FIG. 27 to FIG. 30 correspond to the cross-section shown in FIG. 26.

<Forming the Stacked Body 100, Forming the Staircase Portion 100b, and Forming the Hole HR>

Figure 27:
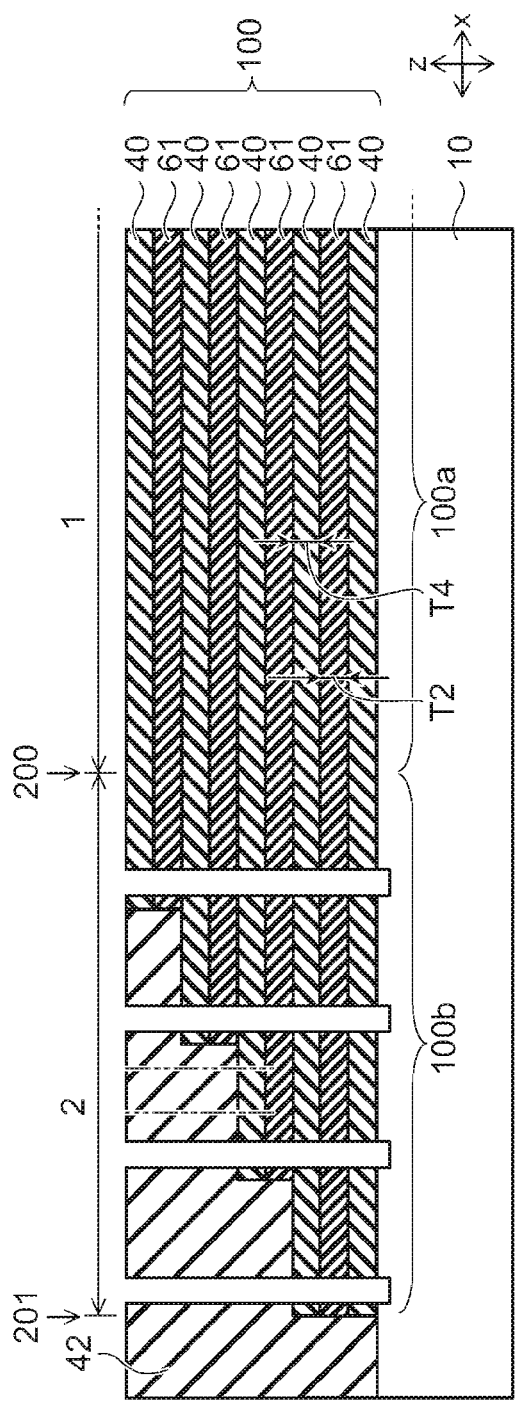
FIG. 27 to FIG. 30 are schematic cross-sectional views showing a method for manufacturing the semiconductor device of the third embodiment.

As shown in FIG. 27, the insulators 40 and the sacrifice layers 61 are alternately stacked on the substrate 10, and the stacked body 100 is formed. In the staircase shown in FIG. 27, the thickness of the sacrifice layer 61 along the stacking direction (Z-direction) is substantially thickness T2. Similarly, the thickness of the insulator 40 along the stacking direction (Z-direction) is substantially thickness T4.

Next, according to the method for manufacturing described with reference to FIG. 9A and FIG. 9B, the staircase portion 100b is formed in the stacked body 100. Next, the recessed portion formed on the staircase portion 100b is filled by the insulating layer 42. Next, the hole HR is formed in the staircase portion 100b. The hole HR is formed until reaching the substrate 10 from an upper surface of the insulating layer 42 and an upper layer of the stacked body 100. The hole HR reaches the substrate 10 via the staircase portion 100b. The insulator 40 and the sacrifice layer 61 are exposed from an inner side wall of the hole HR.

<Process of Reducing a Volume of the Sacrifice Layer 61>

Figure 28:
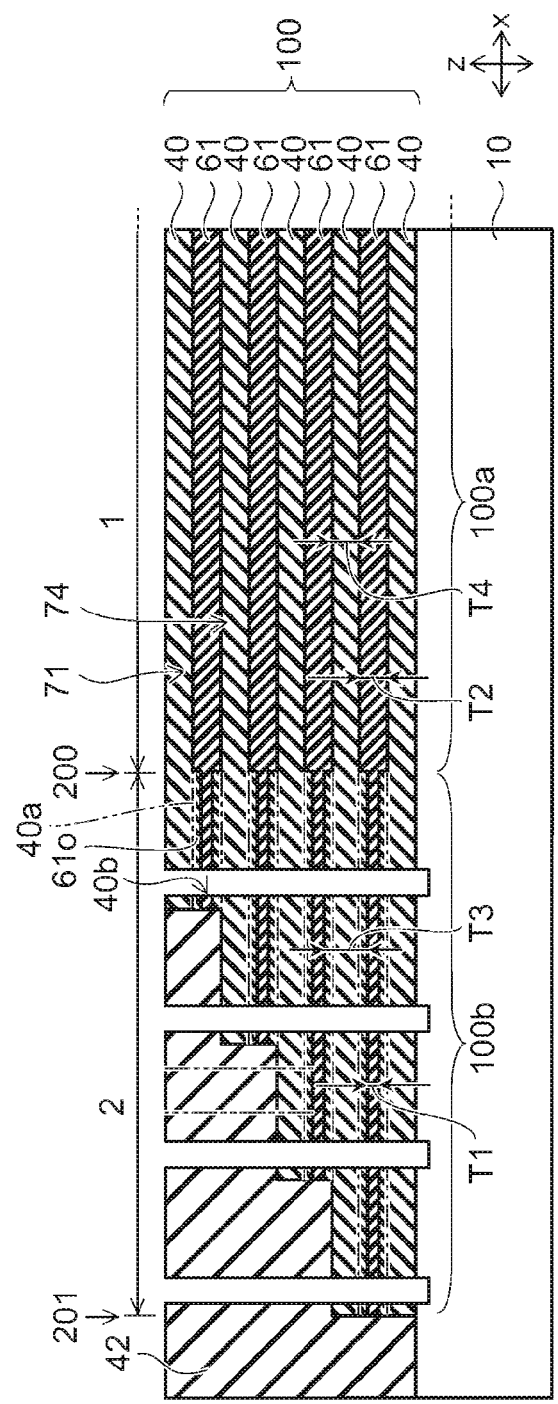

Next, as shown in FIG. 28, the volume of the sacrifice layer 61 is reduced via the hole HR. The volume of the sacrifice layer 61 may be reduced, for example, by oxidizing the sacrifice layer 61. The sacrifice layer 61 includes, for example, silicon nitride. The silicon nitride may be oxidized, for example, by using radical oxidation method using oxygen radical O*.

Figure 31:
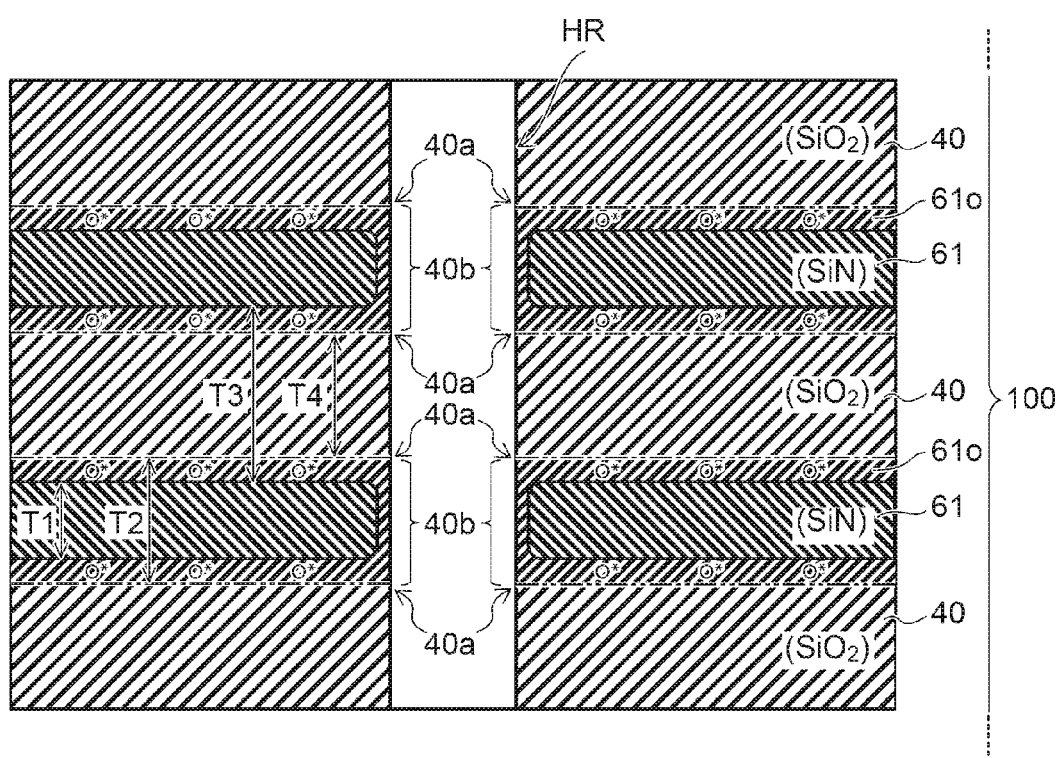
FIG. 31 is a schematic cross-sectional view showing around a hole enlarged.

FIG. 31 is a schematic cross-sectional view showing around the hole HR enlarged.

In the radical oxidation method, for example, the oxygen radical O* enters into the silicon nitride (the sacrifice layer 61) via a boundary surface 40a between the silicon nitride (the sacrifice layer 61) and the silicon oxide (the insulator 40), or via an exposed surface 40b of the silicon nitride (the sacrifice layer 61) corresponding to the hole HR. The oxygen radical O* entering into the silicon nitride (the sacrifice layer 61) advances into the silicon nitride (the sacrifice layer 61) while replacing nitrogen atoms N by oxygen atoms O. Thereby, the silicon nitride (the sacrifice layer 61) is replaced by the silicon oxide 61o (or the silicon oxynitride).

In this way, in the process reducing the volume of the sacrifice layer 61, the sacrifice layer 61 is, for example, replaced by a material different from the sacrifice layer 61, for example, being silicon oxide 61o (or silicon oxynitride) via the boundary surface 40a. As a result, in the staircase portion 100b, the thickness of the sacrifice layer 61 along the stacking direction (Z-direction) is reduced from the thickness T2 to substantially the thickness T1. Further, in the staircase portion 100b, the thickness of the insulator 40 including the thickness of the silicon oxide 61o along the stacking direction (Z-direction) is increased from the thickness T4 to substantially the thickness T3.

Here, in the radical oxidation, for example, oxygen radical generated by plasma acts on silicon. Thus, high quality silicon oxide film being accurately and having little impurity may be formed. In the method oxidation of the sacrifice layer 61, the insulating film 61o may be formed by performing oxidation of the sacrifice layer 61 using the radical oxidation, for example, ozone oxidation method using ozone gas, ISSG (In-Situ Steam Generation) oxidation method using hydrogen gas and oxygen gas, or heat oxidation method such as wet oxidation.

A film density of the insulating film 61o formed by performing oxidation recited above is, for example, higher than a film density of a film formed to deposit by CVD (chemical vapor deposition) and so on. Thus, for example, the film density of the insulating film 61o is higher than the film density of the insulator 40.

Here, the magnitude of "film density" is, for example, possible to be represented be the magnitude of etching rate (reduced speed of the film thickness). For example, a film being high etching late is low film density, and a film being low etching late is high film density. In other words, the identifying of the relative magnitude of the film density is possible, by comparing the amount of reducing of the film thickness when the insulating film 61f and the insulator 40 described above are etched.

Here, the etching rate is, for example, represented with the amount of reducing of the film thickness per unit of time (nm/min). Further, the film density is, for example, represented with the weight per unit of volume (g/cm$^3$), or the number of atoms per unit of volume (atoms/cm$^3$).

<Forming the Support Pillar 118, Forming Columnar Portion CL, and Forming the Slit ST>

Figure 29:
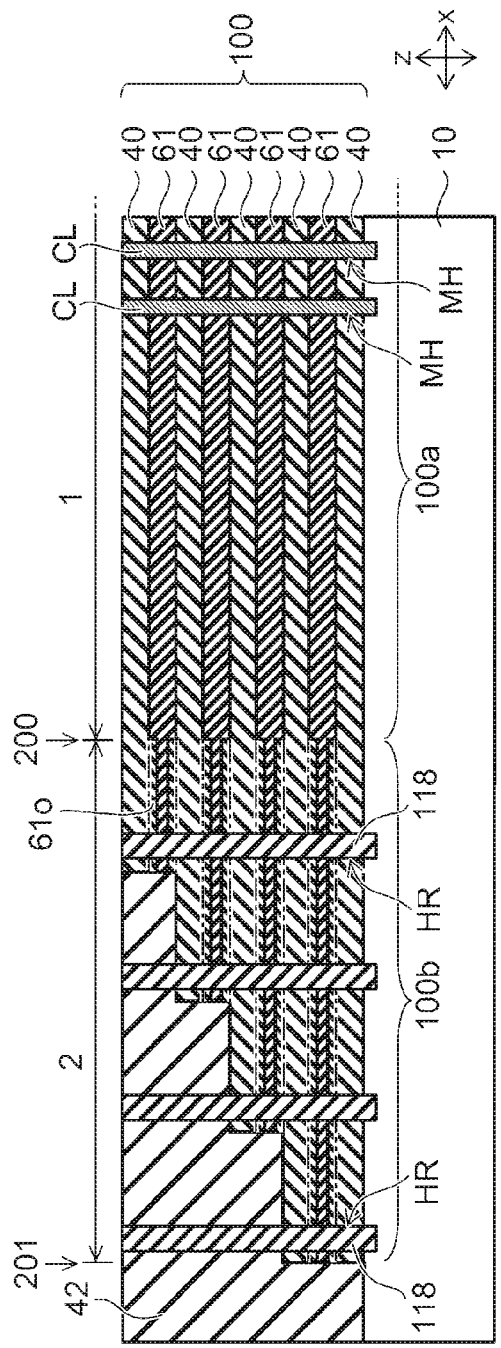

Next, as shown in FIG. 29, the insulating film is formed on the stacked body 100 and the insulating layer 42, and the insulating film is filled in an inner portion of the hole HR. Thereby, the support pillar 118 is formed in the inner portion of the hole HR. Next, the memory hole MH is formed in the stacked portion 100a. The memory hole MH is formed until reaching the substrate 10 from the upper surface of the stacked body 100. The memory hole MH reaches the substrate 10 via the stacked portion 100a Next, for example, according to the method for manufacturing described with reference to FIG. 10A and FIG. 10B, the columnar portion CL is formed in an inner portion of the memory hole MH. Next, for example, according to the method for manufacturing described with reference to FIG. 11A and FIG. 11B, the slit ST is formed in the stacked body 100. Here, the slit ST is not shown in FIG. 29. With respect to the slit ST, for example, see FIG. 11A and FIG. 11B.

<Forming the Space 61r>

Figure 30:
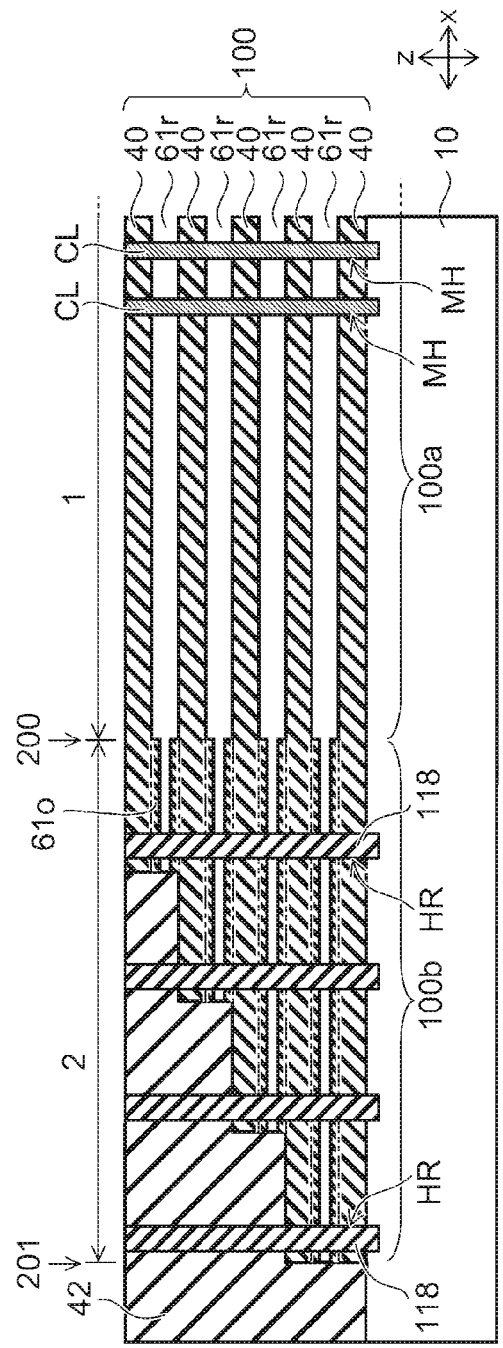

Next, as shown in FIG. 30, the sacrifice layer 61 is removed from the stacked body 100 via the slit ST not shown. Thereby, the space 61r is formed between the insulator 40 and the insulator 40.

<Forming the Electrode Layer (SGD, WL, SGS)>

Next, as shown in FIG. 26, the conductive material is filled in the space 61r via the slit ST. Thereby, the electrode layer (SGD, WL, SGS) is formed between the insulators 40. After that, for example, according to the method for manufacturing described with reference to FIG. 17, the source layer ST is formed in the slit ST not shown, the contact portion Cc is formed in the staircase portion 100b, and the bit line BL and the upper layer interconnect 80 are formed on the stacked body 100.

For example, the semiconductor device of the third embodiment can be manufactured by such a manufacturing method.

Fourth Embodiment: Semiconductor Device

Figure 32:
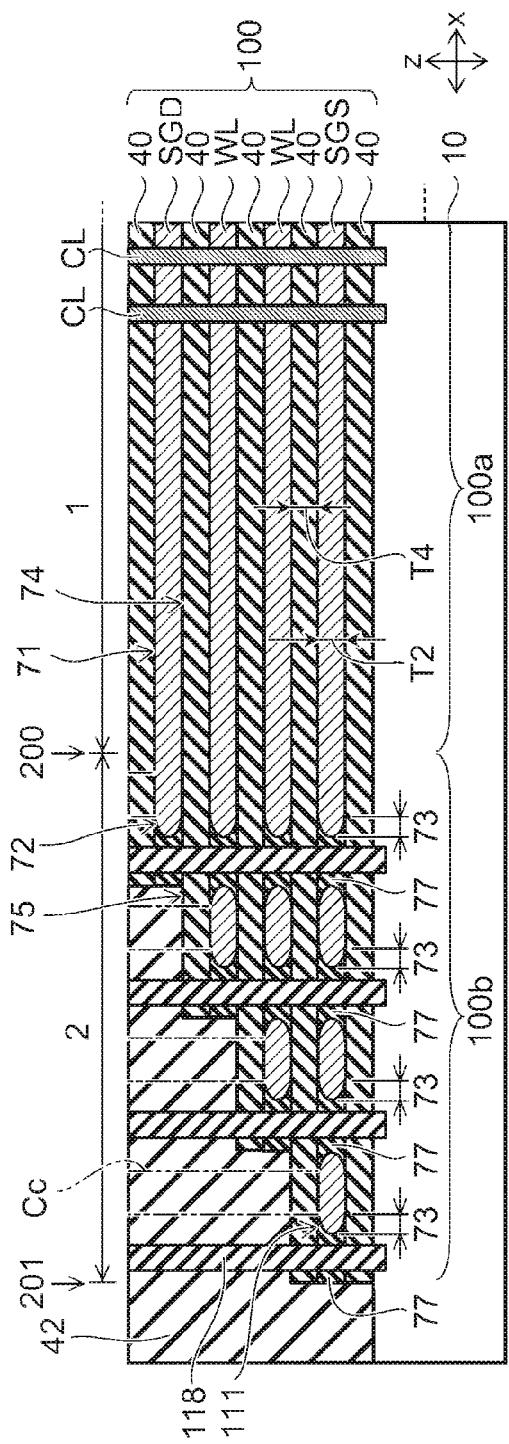
FIG. 32 is a schematic cross-sectional view of the semiconductor device of a fourth embodiment.
Figure 33:
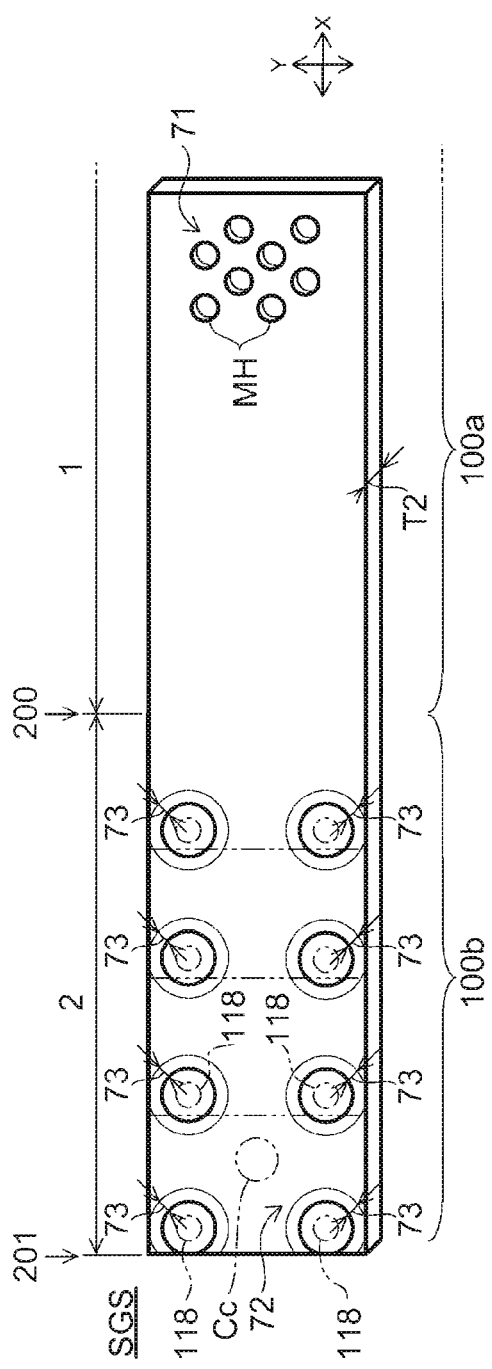
FIG. 33 is a schematic plan view of the electrode layer comprised the semiconductor device of the fourth embodiment.
Figure 34:
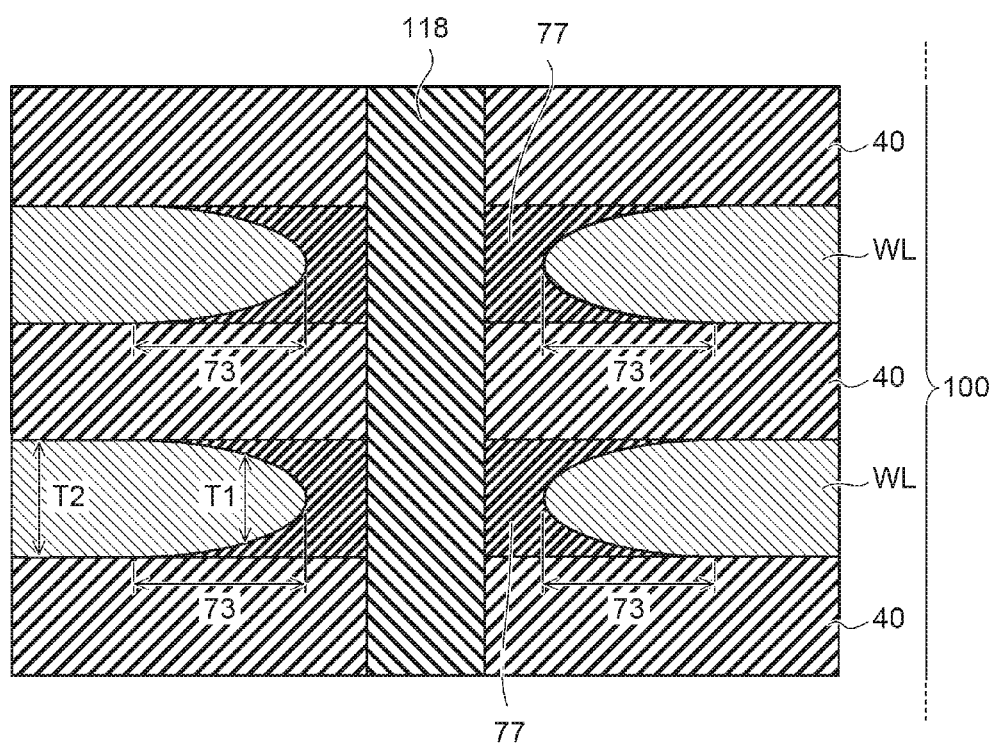
FIG. 34 is a schematic cross-sectional view showing around a support pillar enlarged.

FIG. 32 is a schematic cross-sectional view of the semiconductor device of a fourth embodiment. A cross-section shown in FIG. 32 corresponds to the cross-section shown in FIG. 18. FIG. 33 is a schematic plan view of the electrode layer comprised the semiconductor device of the fourth embodiment. FIG. 34 is a schematic cross-sectional view showing around a support pillar 118 enlarged.

As shown in FIG. 32 to FIG. 34, the semiconductor device of the fourth embodiment is similar to the semiconductor device of the second embodiment in that the third portion 73 of the electrode layer (SGD, WL, SGS) is provided in the portion of the staircase portion 100b. The semiconductor device of the fourth embodiment is different from the semiconductor device of the second embodiment in that the third portion 73 is provided to be dispersed plurality in the staircase portion 100b.

Thus, in the staircase portion 100b, the third portions 73 may be provided to be dispersed plurality.

In the fourth embodiment, the third portion 73 of the electrode layer (SGD, WL, SGS) is, for example, ring shape, and provided around the support pillar 118. Further, in particular as shown in FIG. 34, in the fourth embodiment, a cross-section shape of the third portion 73 of the electrode layer (SGD, WL, SGS) has, for example, a shape having the thickness T1 gradually thinner toward the support pillar 118. The third portion 76 having the cross-section shape may be, for example, formed as follows.

Figure 35:
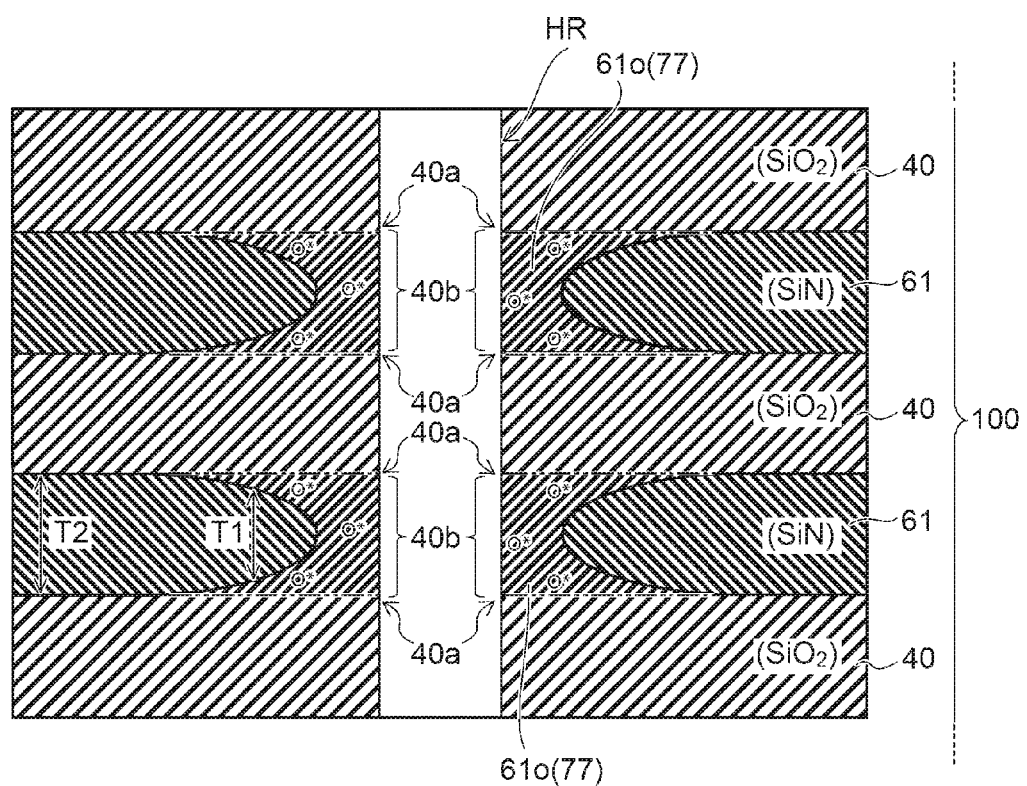
FIG. 35 is a schematic cross-sectional view showing around a hole enlarged.

FIG. 35 is a schematic cross-sectional view showing around the hole HR enlarged. A cross-section shown in FIG. 35 corresponds to the cross-section shown in FIG. 31.

As shown in FIG. 35, the hole HR is formed in the staircase portion 100b. Next, as the method for manufacturing described in the third embodiment, the sacrifice layer 61 exposed from the inner side wall of the hole HR is radical oxidized, for example, using radical oxidation method. Thereby, the sacrifice layer 61 is, for example replaced by the silicon oxide 61o (or the silicon oxynitride) from the exposed surface 40b corresponding to the hole HR.

A condition of the radical oxidation in the fourth embodiment is, for example, a condition that oxidation advances into the sacrifice layer 61 as a "bird beaks" shape along the boundary surface 40a between the silicon nitride (the sacrifice layer 61) and the silicon oxide (the insulator 40). Thereby, in an end portion on the hole HR side of the sacrifice layer 61, the silicon oxide 61o having a parabolic shape in which the central portion is concave is formed. For example, the semiconductor device of the fourth embodiment can be manufactured by such a manufacturing method.

In the fourth embodiment, a cross-section of the silicon oxide 61o is, for example, the parabolic shape in which the central portion is concave. In the fourth embodiment, as shown in FIG. 32, the oxide 61o being the parabolic shape is formed between the insulator 40 and the insulator 40, and between the support pillar 118 and an end portion of the electrode layer (SGD, WL, SGS). The thickness of the insulator 40 is, for example, substantially equal in the memory cell array 1 and in the staircase structure portion 2.

The thickness of the insulator 40 is, for example, thickness T4 in each of the memory cell array 1 and the staircase structure portion 2.

Figure 36:
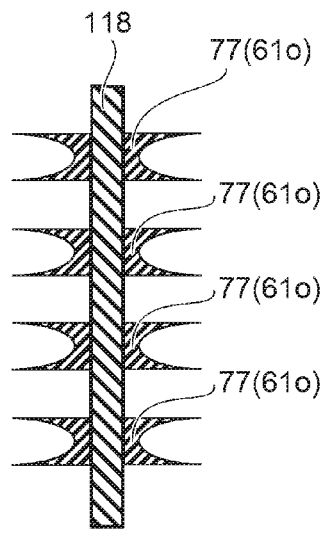
FIG. 36 is a schematic cross-sectional view of the support pillar comprised the semiconductor device of the fourth embodiment.
Figure 37:
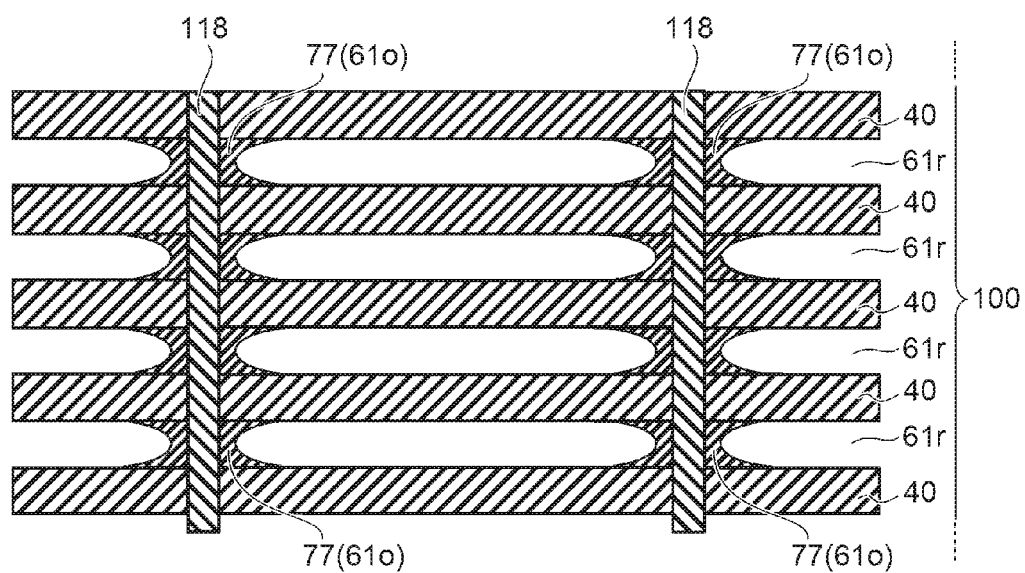
FIG. 37 is a schematic cross-sectional view showing a staircase where a space is formed in the semiconductor device of the fourth embodiment.

FIG. 36 is a schematic cross-sectional view of the support pillar 118 comprised the semiconductor device of the fourth embodiment. FIG. 37 is a schematic cross-sectional view showing a staircase where the space 61r is formed in the semiconductor device of the fourth embodiment.

As shown in FIG. 36, the silicon oxide 61o being the parabolic shape is flange shape, provided around the support pillar 118. In other words, the support pillar 118 included in the semiconductor device of the four embodiment comprises a flange portion 77 around the support pillar 118. The flange portion 77 has, for example, a cross-sectional shape in which the central portion is "concave". The flange portion 77 is, for example, provided to correspond to the third portion of the electrode layer (SGD, WL, SGS).

As shown in FIG. 37, in the staircase where the space 61r is formed between the insulator 40 and the insulator 40, the flange portion 77 supports the insulator 40 with the support pillar 118. Thereby, the flange portion 77 functions as a reinforce member reinforcing the support pillar 118. In the fourth embodiment including the support pillar 118 comprising the flange portion 77 around, the mechanical strength of the insulator 40 in the staircase structure portion 2 may be further increased compared to the case where there is no the flange portion 77.

Further, the flange portion 77 has the cross-sectional shape in which the central portion is "concave". The third portion 73 having the thickness being thin in the electrode layer (SGD, WL, SGS) is formed by the portion being "concave" along around the support pillar 118. The flange portion 77 is insulating material. The flange portion 77 includes, for example, silicon oxide or silicon oxynitride. Thus, similar to the first to the third embodiment, in the staircase structure portion 2, the parasitic capacitance of the electrode layer (SGD, WL, SGS) is reduced. Therefore, compared to the case where there is no the flange portion 77, the semiconductor device including the support pillar 118 comprising the flange portion 77 may reduce the RC time constant of the electrode layer (SGD, WL, SGS), and, for example, "electric characteristic" represented by "signal response characteristic (charging and discharging characteristic)" of the electrode layer (SGD, WL, SGS) may be increased.

Fifth Embodiment: Semiconductor Device

Figures 38, 39:
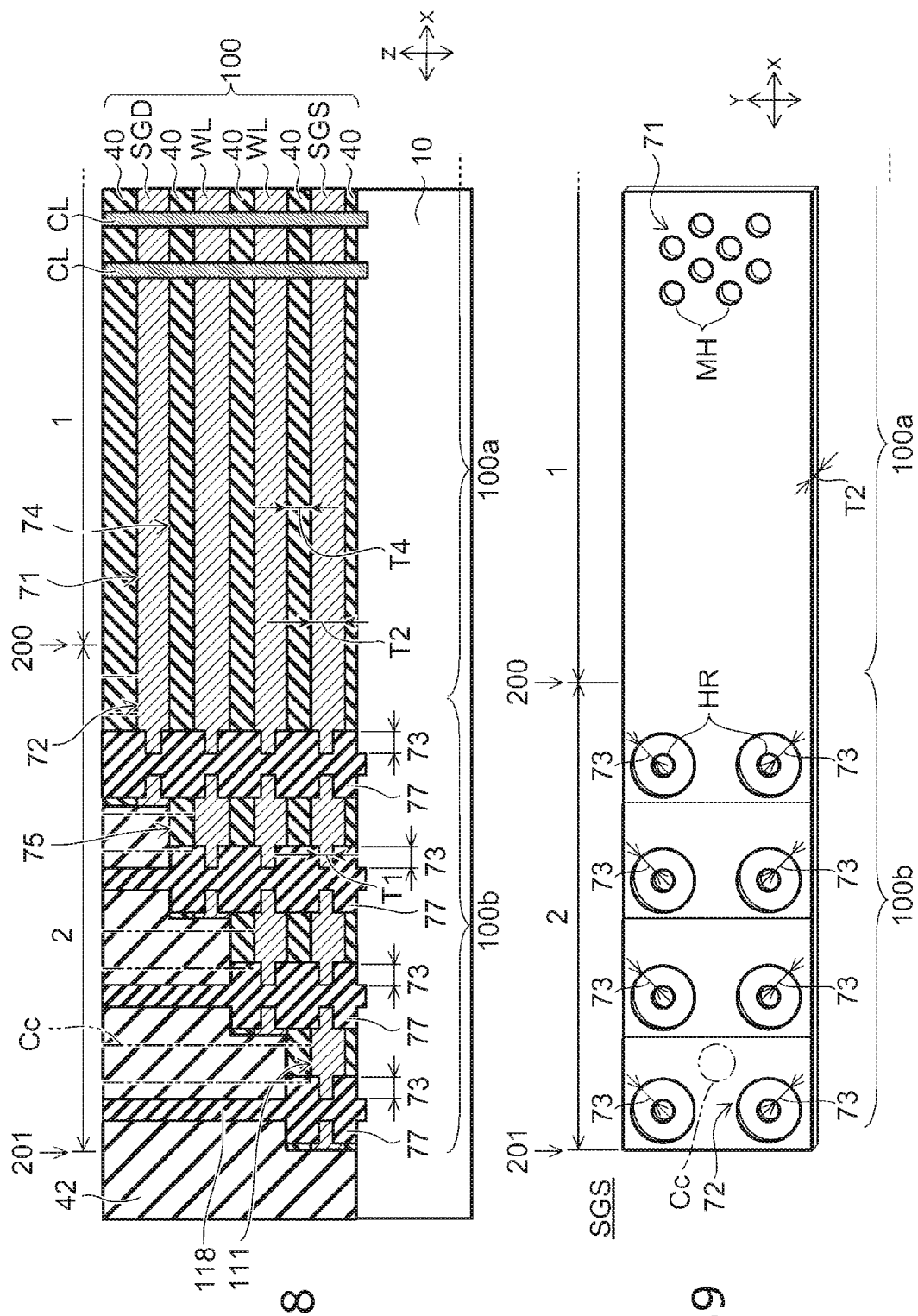
FIG. 38 is a schematic cross-sectional view of the semiconductor device of a fifth embodiment.
FIG. 39 is a schematic plan view of the electrode layer comprised the semiconductor device of the fifth embodiment.
Figure 40:
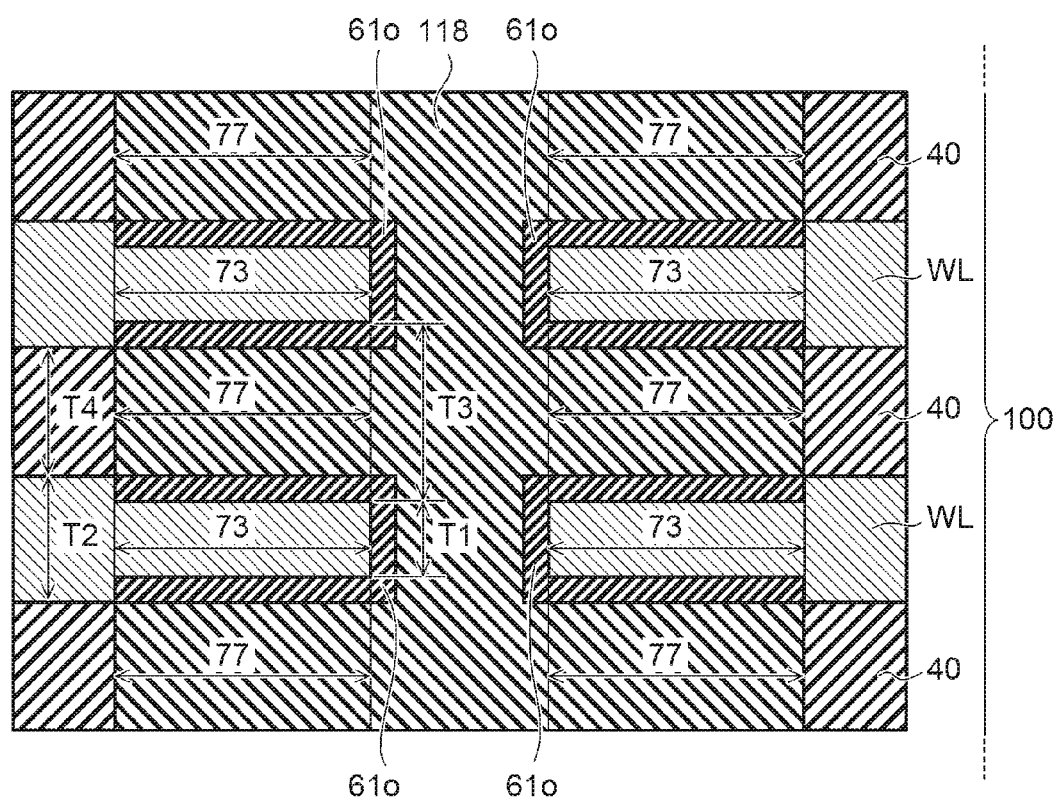
FIG. 40 is a schematic cross-sectional view showing around the support pillar enlarged.

FIG. 38 is a schematic cross-sectional view of the semiconductor device of the fifth embodiment. A cross-section shown in FIG. 38 corresponds to the cross-section shown in FIG. 32. FIG. 39 is a schematic plan view of the electrode layer comprised the semiconductor device of the fifth embodiment. FIG. 40 is a schematic cross-sectional view showing around the support pillar 118 enlarged.

As shown in FIG. 38 to FIG. 40, the semiconductor device of the fifth embodiment is different from the semiconductor device of the fourth embodiment in that a same insulating material is used for the support pillar 118 and the flange portion 77.

In this way, the flange portion 77 may be formed of the insulating material same as the support pillar 118.

Further, in particular, as shown in FIG. 40, the fifth embodiment comprises the silicon oxide 61o correspond to the flange portion 77. The silicon oxide 61o is formed by radical oxidizing the sacrifice layer 61, for example, using radical oxidation method. If the sacrifice layer 61 is, for example, silicon nitride, the portion of the sacrifice layer 61 radical oxidized is replaced by the silicon oxide (or silicon oxynitride) 61o. Thereby, the volume of the sacrifice layer 61 is reduced. By reducing the volume of the sacrifice layer 61, the thickness T1 of the electrode layer (SGD, WL, SGS) formed to replace the sacrifice layer 61 is thin compared with the thickness. The portion where the thickness of the electrode layer (SGD, WL, SGS) is "T2" is the third portion 73. Further, the flange portion 77 increases in thickness by the silicon oxide 61o formed. Therefore, the thickness T3 of the flange 77 is thicker than the thickness T4 of the insulator 40.

Figure 41:
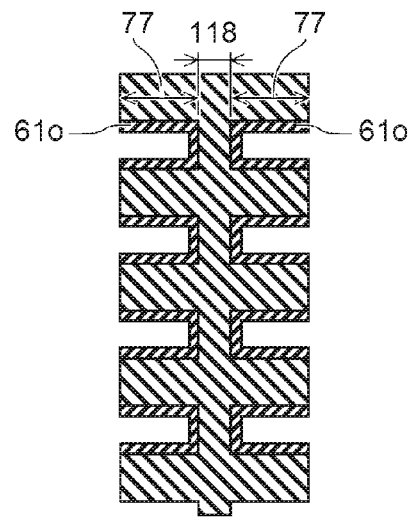
FIG. 41 is a schematic cross-sectional view of the support pillar comprised the semiconductor device of the fifth embodiment.
Figure 42:
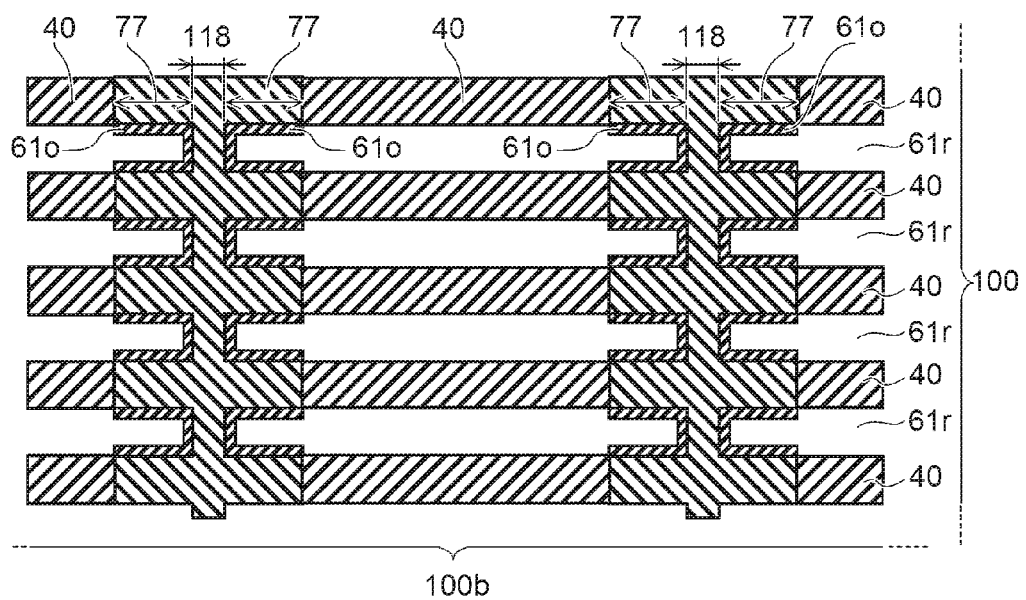
FIG. 42 is a schematic cross-sectional view showing the staircase where the space is formed in the semiconductor device of the fifth embodiment.

FIG. 41 is a schematic cross-sectional view of the support pillar 118 comprised the semiconductor device of the fifth embodiment. FIG. 42 is a schematic cross-sectional view showing the staircase where the space 61r is formed in the semiconductor device of the fifth embodiment.

As shown in FIG. 41 and FIG. 42, similar to the fourth embodiment, although the flange portion 77 is formed of the insulating material same as the support pillar 118, the flange portion 77 supports the insulator 40 with the support pillar 118. Therefore, also in the fifth embodiment, as well as the fourth embodiment, the mechanical strength of the insulator 40 is improved in the staircase structure portion 2.

Further, in the flange portion 77, by which the silicon oxide 61o is further provided, the thickness of the flange portion 77 is increased by the silicon oxide 61o. Further, the thickness of the electrode layer (SGD, WL, SGS) is reduced by the silicon oxide 61o. Thereby, similar to the fourth embodiment, the RC time constant of the electrode layer (SGD, WL, SGS) may be reduced. Therefore, also in the fifth embodiment, for example, "signal response characteristic (charging and discharging characteristic)" of the electrode layer (SGD, WL, SGS) may be increased.

Fifth Embodiment: Manufacturing Method

Next, one example of a method for manufacturing a semiconductor device according to the fifth embodiment will be described.

FIG. 43 to FIG. 49B are schematic cross-sectional views showing a method for manufacturing the semiconductor device of the fifth embodiment. FIG. 44A to FIG. 45B, FIG. 47A, FIG. 48A, and FIG. 49A are schematic cross-sectional views based on D-D' cross-section in FIG. 43. FIG. 46A, FIG. 46B, FIG. 47B, FIG. 48B, and FIG. 49B are schematic cross-sectional views based on E-E' cross-section in FIG. 43.
<Forming the Stacked Body 100, and Forming the Staircase Portion 100b.>

Figure 43:
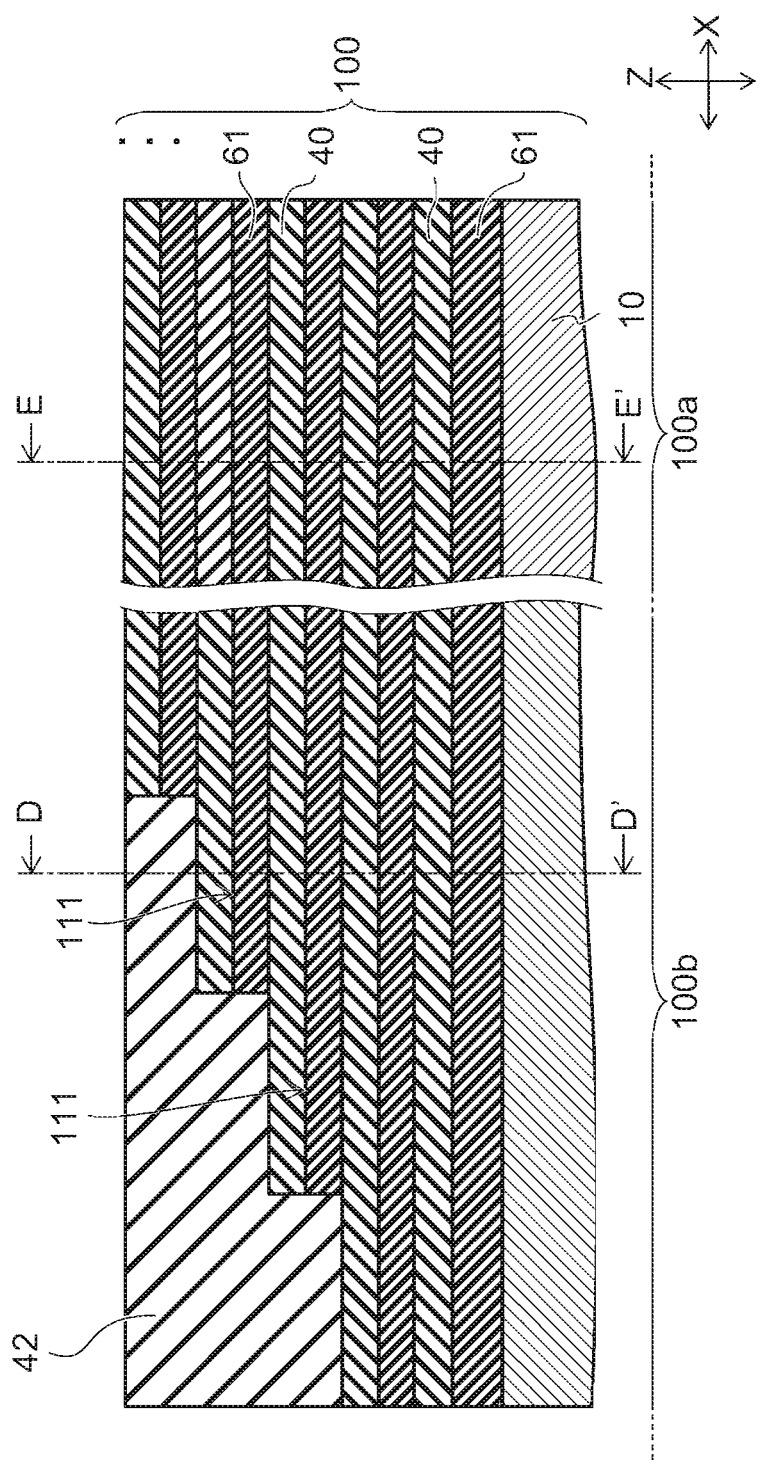

As shown in FIG. 43, for example, according to the method for manufacturing described with reference to FIG. 9A and FIG. 9B, the stacked body 100 is formed on the major surface of the substrate. Next, the staircase portion 100b is formed in the stacked body 100. Next, the insulating film 42 is filled in the concave portion formed on the staircase portion 100b.
<Forming the Support Pillar 118>

Figure 44A:
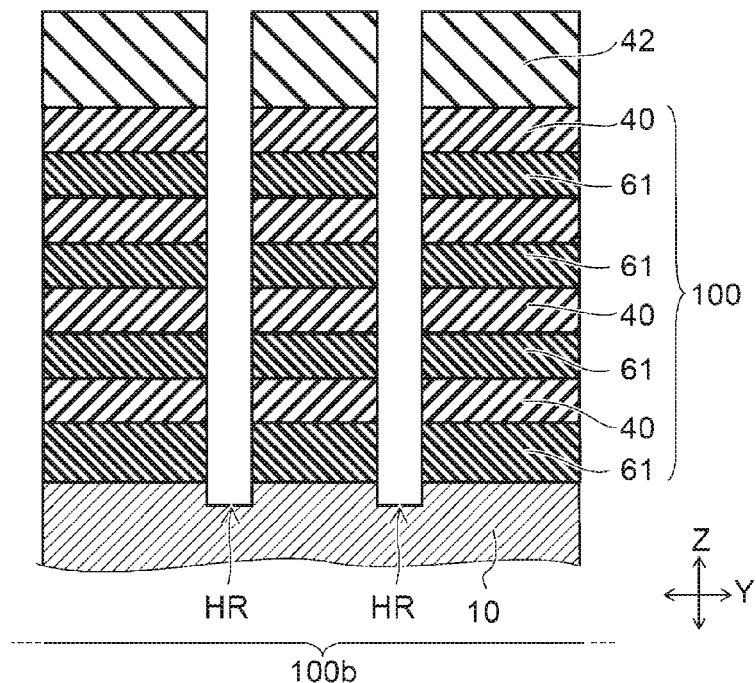

Next, as shown in FIG. 44A, the hole HR is formed in the staircase portion 100b. The hole HR pierces the staircase portion 100b, and reaches the substrate 10. The substrate 10, the plurality of sacrifice layers 61, and the plurality of insulators 40 are exposed from the side surface of the hole HR, and the substrate 10 is exposed from the bottom surface of the hole HR.
<Recessing the Insulator 40>

Figure 44B:
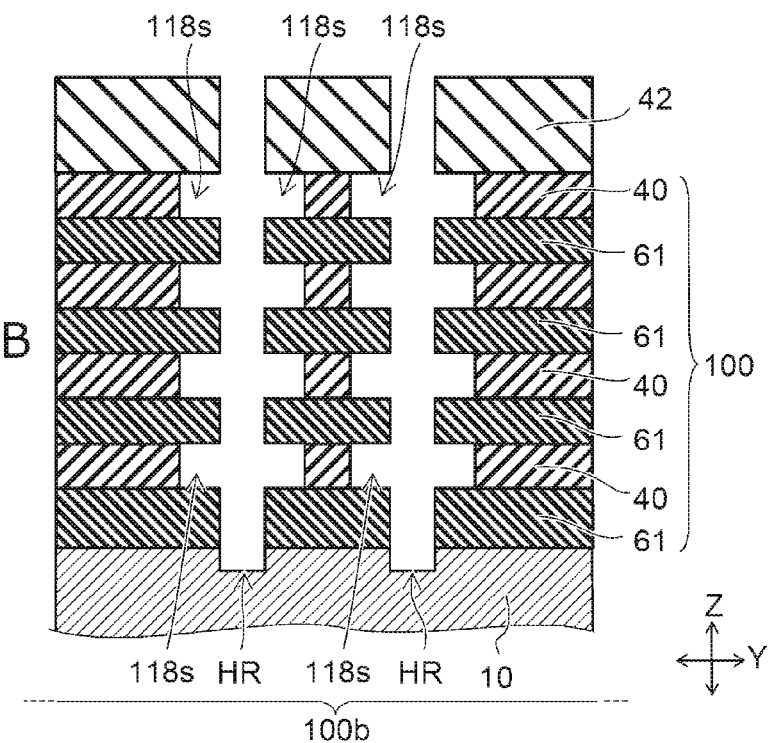

Next, as shown in FIG. 44B, the insulator 40 exposed from the side surface of the hole HR is recessed along the sacrifice layer 61. The space 118s is formed in the portion where the insulator 40 is removed. The sacrifice layer 61 is exposed from an inner portion of the space 118s. Here, the backing amount of the insulator 40 is arbitrary within a range in which the stacked body 100 does not collapse.
<Process of Reducing the Volume of the Sacrifice Layer 61>

Figure 45A:
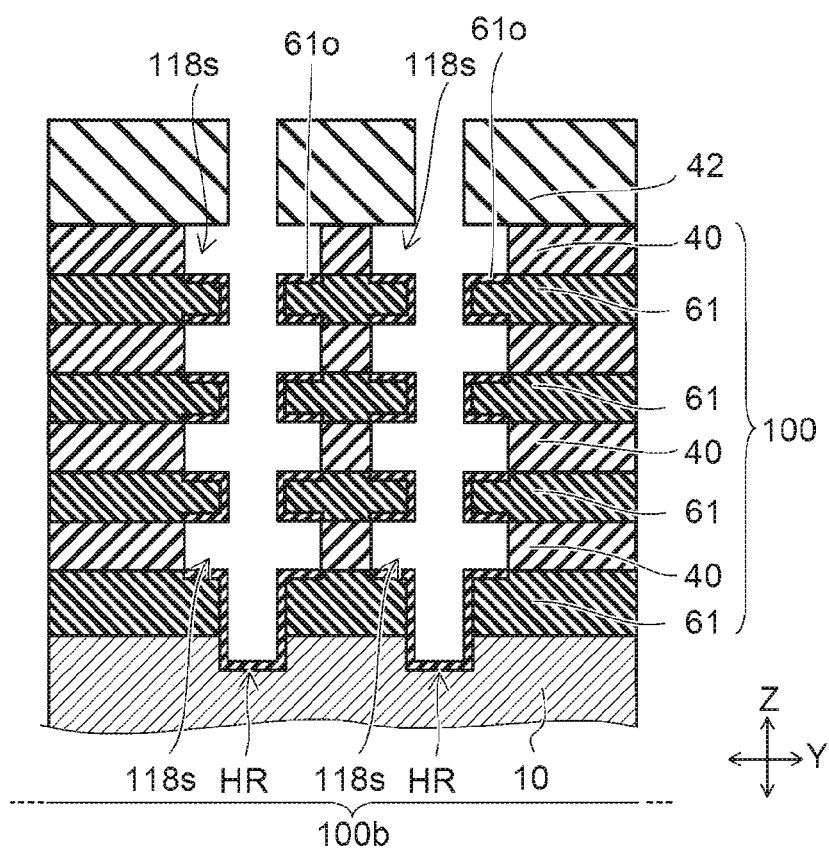

Next, as show in FIG. 45A, the sacrifice layer 61 exposed in hole HR including the space 118s is, for example, oxidized. Thereby, the silicon oxide (or silicon oxynitride) 61o is, for example, formed between the hole HR and the sacrifice layer 61. Thereby, the volume of the sacrifice layer 61 is reduced. Here, in the process, for example, the substrate 10 exposed from the bottom of the hole HR is also oxidized.

As described with reference to FIG. 31, radical oxidation method, ozone oxidation method, ISSG oxidation method, or heat oxidation method such as wet oxidation may be used to oxidize the sacrifice layer 61.
<Forming the Support Pillar 118>

Figure 45B:
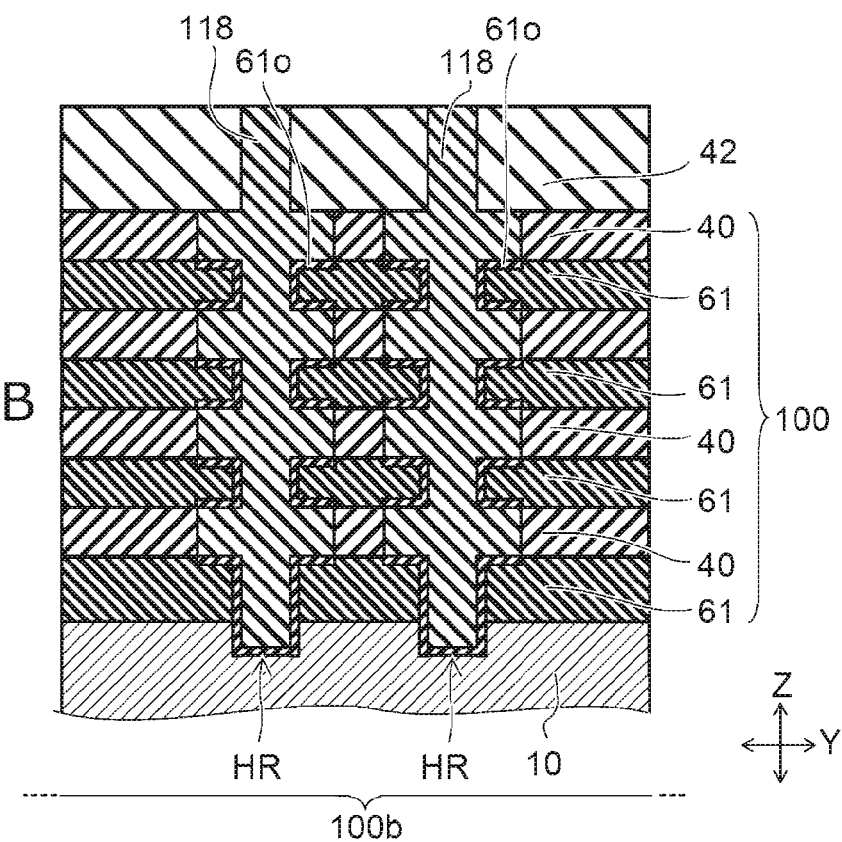

Next, as shown in FIG. 45B, the support pillar 118 is formed in the hole HR including the space 118s. A material of the support pillar 118 is selected from materials that are different from the sacrifice layer 61, and can provide etching selectivity with respect to the sacrifice layer 61. For example, when a silicon nitride is selected as the material of the sacrifice layer 61, a silicon oxide is selected for the material of the support pillar 118. Here, a film density of the silicon oxide 61o is higher than a film density of the support pillar 118.
<Forming the Memory Hole MH>

Next, as shown in FIG. 46A, the memory hole MH is formed in the stacked portion 100a. The memory hole MH pierces the stacked portion 100a and reaches the substrate 10. The sacrifice layer 61 and the insulator 40 are exposed from the side surface of the memory hole MH, the substrate 10 is exposed from the bottom surface of the memory hole MH. The array density of the memory hole MH is higher than the array density of the hole HR. Next, the protrusion portion 10e is formed in the memory hole MH. The protrusion portion 10e is formed until a prescribed height by epitaxial growth method by using the substrate 10 exposed from the bottom surface of the memory hole MH as nucleus. The height of the protrusion portion 10e is, for example, set to a value of a position between a lowest layer of the sacrifice layers 61 and the sacrifice layer 61 on the lowest layer of the sacrifice layers 61.
<Forming the Columnar Portion CL>

Next, as shown in FIG. 46B, for example, according to the method for manufacturing described with reference to FIG. 10A and FIG. 10B, the columnar portion CL is formed in the memory hole MH. In order to form the columnar portion CL, for example, the memory film 30 is formed on the side wall of the memory hole MH. Next, a bottom portion of the memory film 30 is removed, and the protrusion portion 10e is exposed in the bottom of the memory hole MH. Next, the semiconductor body 20 is formed on the memory film 30 and the protrusion portion 10e. The semiconductor body 20 is electrically connected to the protrusion portion 10e. Next, the core layer 50 is formed on the semiconductor body 20. Thereby, an inside of the memory hole MH is filled by the memory film 30, the semiconductor body 20, and the core layer 50. Thereby, the columnar portion CL is formed in the memory hole MH.
<Forming the Slit ST>

Figure 47A:
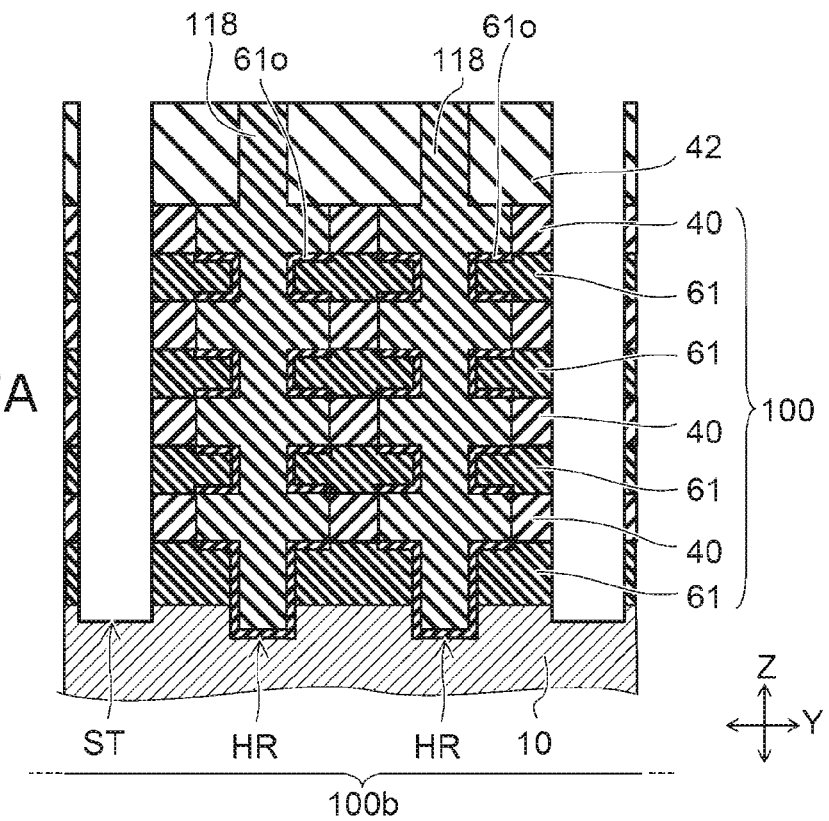
Figure 47B:
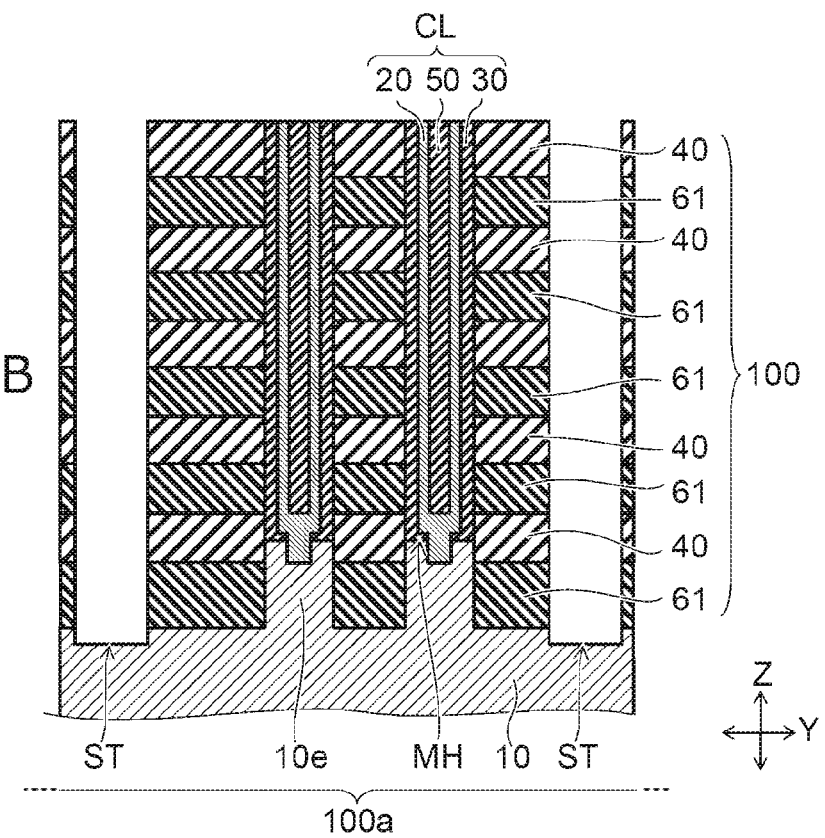

Next, as shown in FIG. 47A and FIG. 47B, the slit ST is formed in the stacked body 100.

<Forming the Space 61r>

Figure 48A:
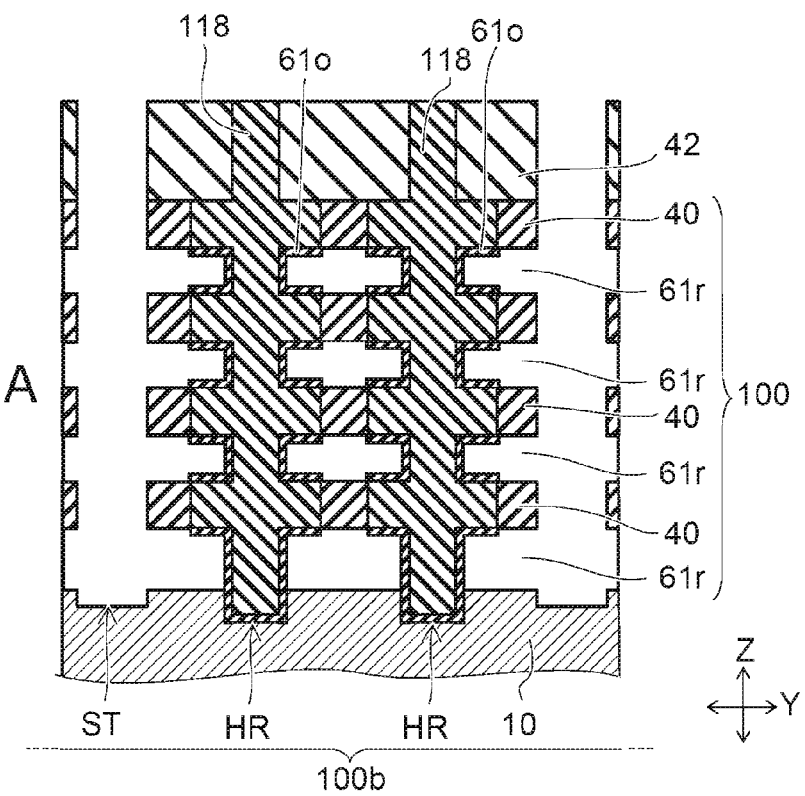
Figure 48B:
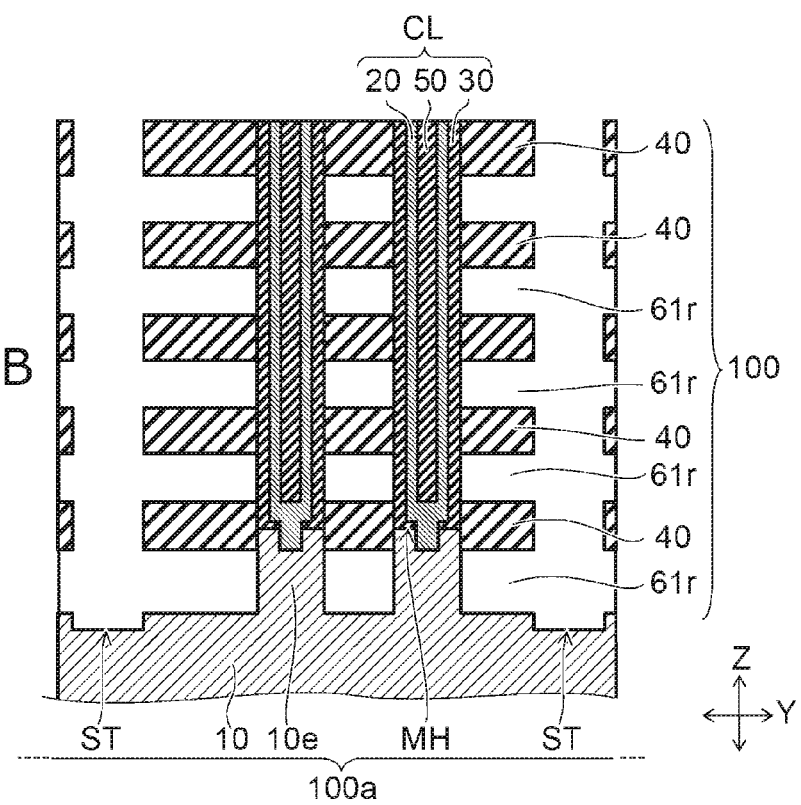

Next, as shown in FIG. 48A and FIG. 48B, the sacrifice layer 61 is removed from the stacked body 100. Thereby, the space 61r is formed between the insulator 40 and the insulator 40. At this time, in the fifth embodiment, in an inner portion of the space 61r, the insulating film 61o is formed on a surface of the support pillar 118. The insulating film 61o reinforces the support pillar 118, and the mechanical strength of the insulator 40 is improved. As a result, compared to the case where the insulating film 61o does not existed on the surface of the support pillar 118, the warping of the insulator 40 may be suppressed.

Further, the insulating film 61o is high quality silicon oxide film being accurately and having little impurity. Thus, for example, compared with a silicon oxide film formed by using CVD method, the etching rate is low when the sacrifice layer 61 is removed. Therefore, according to the fifth embodiment in which the insulating film 61o is formed on the surface of the support pillar 118, when the sacrifice layer 61 is removed, the insulating film 61o also functions as a stopper of etching. Thus, deterioration of the support pillar 118 may be also suppressed.

<Forming the Electrode Layer (SGD, WL, SGS)>

Figure 49A:
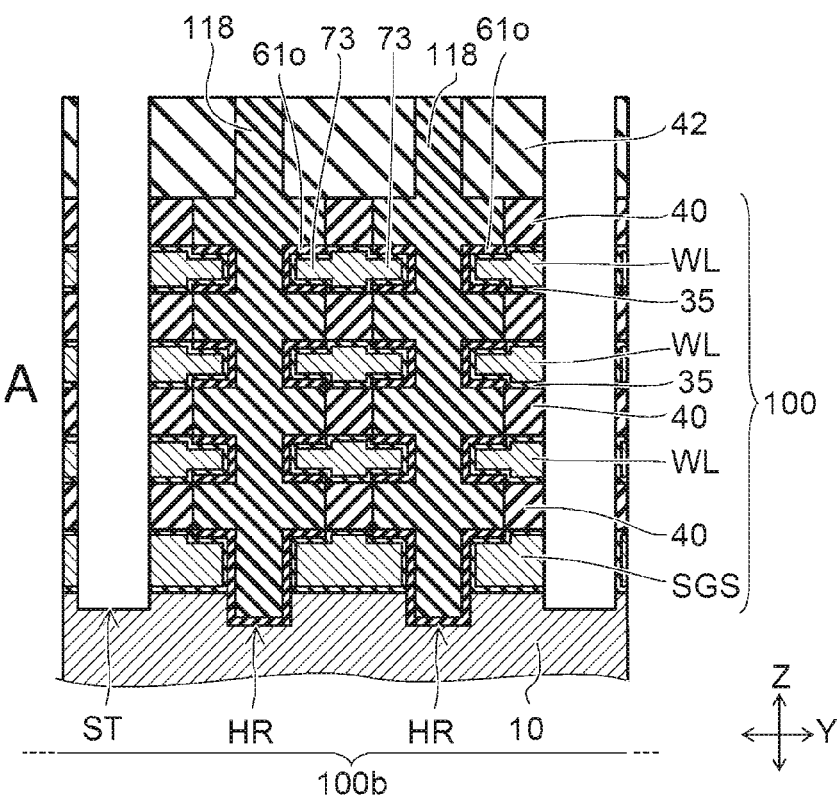
Figure 49B:
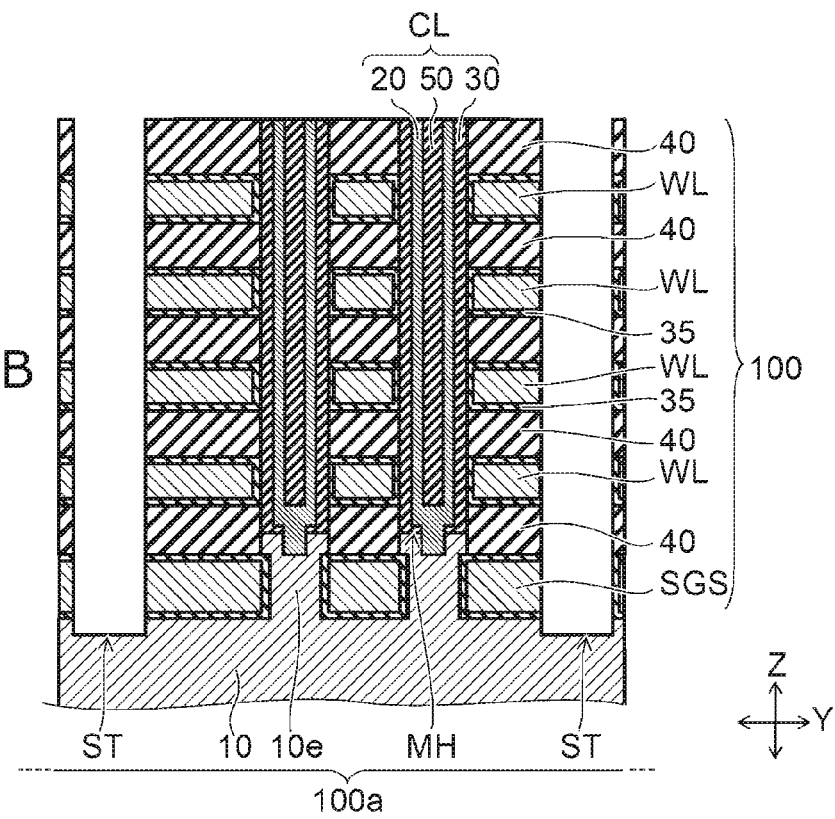

Next, as shown in FIG. 49A and FIG. 49B, the electrode layer (SGS, WL, SGD) is formed in the space 61r via the slit ST.

Before forming the electrode layer (SGS, WL, SGD), as illustrated in figure, the blocking insulating film 35 may be formed. The blocking insulating film 35 includes, for example, a stacked film being an insulating material having a silicon oxide as a major component and an insulating material having a metal oxide as a major component. The electrode layer (SGS, WL, SGD) includes, for example, tungsten.

<Forming the Source Layer, and Forming the Contact Portion>

After that, for example, according to the method for manufacturing described with example to FIG. 17, the insulating film 43 is formed on the side wall of the slit ST, the source layer SL is formed in the slit ST, and the contact portion Cc is formed in the staircase portion 100b. Furthermore, as shown in FIG. 2, the bit line BL and the upper layer interconnect 80 and so on are formed on the stacked body 100.

For example, the semiconductor device of the fifth embodiment can be manufactured by such a manufacturing method.

Further, the process forming the hole HR in the staircase portion 100b shown in FIG. 44A may be, for example, simultaneously performed with forming the memory hole MH shown in FIG. 46A.

Figure 50A:
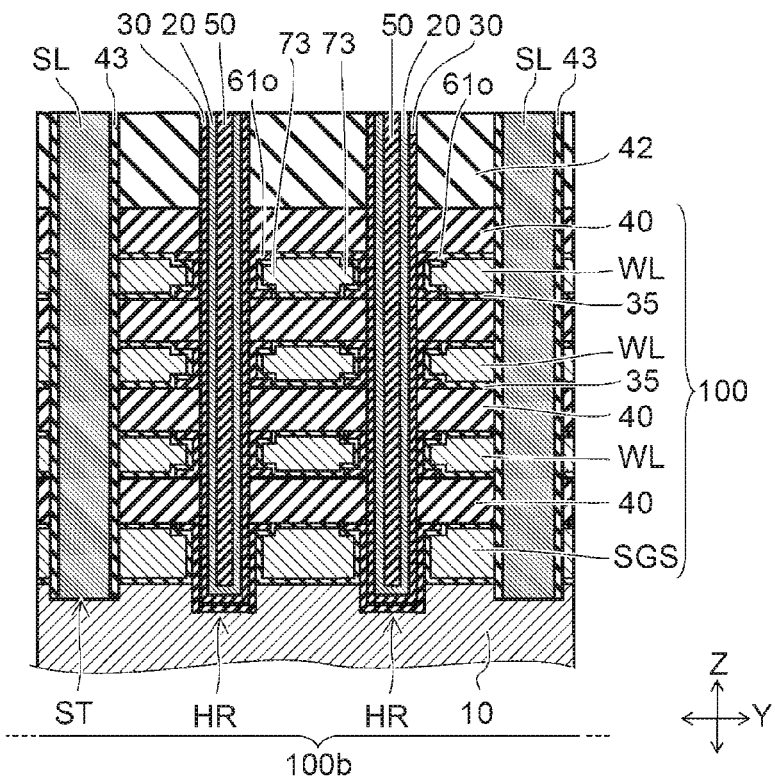
FIG. 50A and FIG. 50B are schematic cross-sectional views of a variation of the fifth embodiment.
Figure 50B:
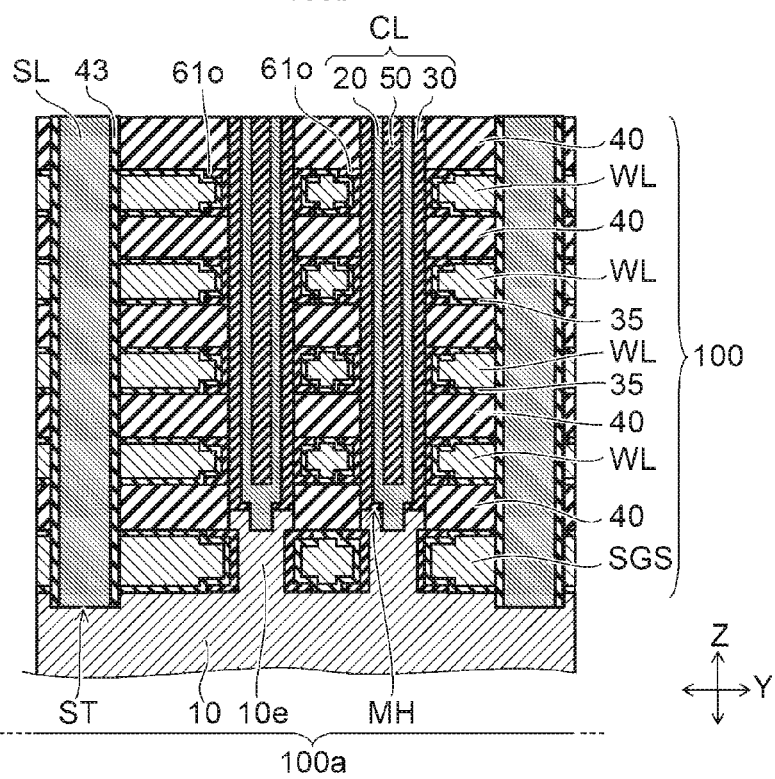

FIG. 50A and FIG. 50B are schematic cross-sectional views of a variation of the fifth embodiment. FIG. 50A is a schematic cross-sectional view based on the D-D' cross-section in FIG. 43. FIG. 50B is a schematic cross-sectional view based on the E-E' cross-section in FIG. 43.

In the process shown in FIG. 46A, in the case where the memory hole MH and the hole HR is simultaneously formed, for example, as shown in FIG. 50A, similar to the memory hole MH, the memory film 30, the semiconductor body 20, and the core layer 50 are formed in the hole HR. Further, as shown in FIG. 50B, the silicon oxide 61o is formed between the columnar portion CL and the electrode layer (SGD, WL, SGS).

Also in this case, the silicon oxide 61o reinforces the memory film 30, the semiconductor body 20, and the core layer 50 formed in the hole HR. Thus, in the staircase portion 100b, the warping of the insulator 40 may be suppressed. Further, the parasitic capacitance of the electrode layer (SGD, WL, SGS) may be reduced, so the RC time constant of the electrode layer (SGD, WL, SGS) may be also reduced.

Thus, according to the embodiment, the semiconductor device being possible that the enhancing of the mechanical strength of the staircase portion 100b of the stacked body 100 may be obtained. Further, the semiconductor device in that the RC time constant of the electrode layer (SGD, WL, SGS), and, for example, "electric characteristic" represented by "signal response characteristic (charging and discharging characteristic)" of the electrode layer (SGD, WL, SGS) may be improved may be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate;
a stacked body provided on the substrate,
the stacked body including a plurality of electrode layers stacked with an insulator interposed,
the stacked body including a stacked portion and a staircase portion,
the staircase portion provided outside the stacked portion,
the plurality of electrode layers including a first portion and a second portion,
the first portion provided in the stacked portion,
the second portion provided in the staircase portion,
the second portion stacked in a staircase pattern in the staircase portion; and
a plurality of columnar portions provided in the stacked portion of the stacked body,
the plurality of columnar portions extending in a stacking direction of the stacked body,
the plurality of columnar portions including a semiconductor body extending in the stacking direction, and a charge storage film,
the charge storage film provided between the semiconductor body and the plurality of electrode layers, wherein
the second portion of the electrode layers includes a third portion, and
a thickness of the third portion of the electrode layers along the stacking direction of the stacked body is thinner than a thickness of the first portion of the electrode layers along the stacking direction of the stacked body.

2. The semiconductor device according to claim 1, wherein, the third portion is provided in an entire area of the staircase portion.

3. The semiconductor device according to claim 1, wherein, the third portion is provided in a portion of the staircase portion.

4. The semiconductor device according to claim 1, including a first insulating film provided between the third portion of the electrode layers and the insulator.

5. The semiconductor device according to claim 1, further comprising a contact portion provide on the staircase portion, wherein
the contact portion is electrically connected to the second portion of the electrode layers.

6. The semiconductor device according to claim 1, including a plurality of support pillars provided in the staircase portion, wherein
an array density of the plurality of support pillars is lower than an array density of the plurality of columnar portions.

7. The semiconductor device according to claim 6, wherein the third portion of the electrode layers is provided around the support pillars.

8. The semiconductor device according to claim 7, wherein
at least one of the support pillar includes a flange portion, and
the flange portion is provided to correspond to the third portion of the electrode layers.

9. The semiconductor device according to claim 8, including a second insulating film between the third portion of the electrode layers and the flange portion of the support pillars.

10. The semiconductor device according to claim 9, wherein
the second insulating film and the insulator include silicon oxide, and
a film density of the insulating film is higher than a film density of the insulator.

11. The semiconductor device according to claim 1, wherein
the first portion of the electrode layers includes a fourth portion around the columnar portions,
a thickness of the fourth portion of the electrode layers along the stacking direction of the stacked body is thinner than the thickness of the first portion of the electrode layers along the stacking direction of the stacked body, and
equal to the thickness of the third portion of the electrode layers along the stacking method of the stacked body.

12. The semiconductor device according to claim 11, including a third insulating film provided between the fourth portion of the electrode layers and the insulator.

13. The semiconductor device according to claim 1, wherein
the insulator of the stacked body includes a fifth portion provided in the stacked portion, and a sixth portion provided in the staircase portion and stacked in a staircase pattern in the staircase portion,
the sixth portion of the insulator includes a seven portion, and
a thickness of the seventh portion of the insulator along the stacking direction of the stacked body is thicker than a thickness of the fifth portion of the insulator along the stacking direction of the stacked body.

14. The semiconductor device according to claim 13, wherein, the seventh portion is provided in an entire area of the staircase portion.

15. The semiconductor device according to claim 13, wherein, the seventh portion is provided in a portion of the staircase portion.

16. The semiconductor device according to claim 13, wherein
the seventh portion of the insulator includes a fourth insulating film, and
the fourth insulating film is provided in contact with the electrode layers.

* * * * *